(12) United States Patent
Yoshioka et al.

(10) Patent No.: US 11,387,132 B2
(45) Date of Patent: Jul. 12, 2022

(54) CERAMIC MATERIAL AND ELECTROSTATIC CHUCK DEVICE

(71) Applicant: SUMITOMO OSAKA CEMENT CO., LTD., Tokyo (JP)

(72) Inventors: Yoshiki Yoshioka, Tokyo (JP); Nobuhiro Hidaka, Tokyo (JP); Hironori Kugimoto, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 838 days.

(21) Appl. No.: 16/072,750

(22) PCT Filed: Jan. 27, 2017

(86) PCT No.: PCT/JP2017/002934
§ 371 (c)(1),
(2) Date: Jul. 25, 2018

(87) PCT Pub. No.: WO2017/131159
PCT Pub. Date: Aug. 3, 2017

(65) Prior Publication Data
US 2019/0043746 A1 Feb. 7, 2019

(30) Foreign Application Priority Data

Jan. 27, 2016 (JP) ................................. 2016-013843
Mar. 29, 2016 (JP) ............................. JP2016-065345

(51) Int. Cl.
*H01L 21/683* (2006.01)
*C04B 35/117* (2006.01)
(Continued)

(52) U.S. Cl.
CPC ........ *H01L 21/6833* (2013.01); *B25J 9/0012* (2013.01); *B25J 11/0095* (2013.01);
(Continued)

(58) Field of Classification Search
CPC ............. H01L 21/6833; H01L 21/6831; H01L 21/68757; B25J 9/0012; B25J 11/0095;
(Continued)

(56) References Cited

U.S. PATENT DOCUMENTS 4,133,689 A * 1/1979 Stroke .................... C01B 32/956
264/645
2012/0321853 A1* 12/2012 Iida ........................ C04B 35/638
428/149

FOREIGN PATENT DOCUMENTS

JP 61-021964 A 1/1986
JP 61-021965 A 1/1986
(Continued)

OTHER PUBLICATIONS

International Search Report for PCT/JP2017/002934 (dated May 9, 2017).

*Primary Examiner* — Karl E Group
*Assistant Examiner* — Cameron K Miller
(74) *Attorney, Agent, or Firm* — Merchant & Gould P.C.

(57) ABSTRACT

Provided is a composite sintered body for an electrostatic chuck, which is not easily broken even if it is exposed to high-power plasma. Further, provided are an electrostatic chuck device using such a composite sintered body for an electrostatic chuck and a method of manufacturing a composite sintered body for an electrostatic chuck. The composite sintered body for an electrostatic chuck is a composite sintered body including an insulating ceramic and silicon carbide, in which crystal grains of the silicon carbide are dispersed in at least one selected from the group consisting of a crystal grain boundary and a crystal grain of a main phase formed by sintering crystal grains of the insulating ceramic.

7 Claims, 4 Drawing Sheets

(51) Int. Cl.
  *C04B 35/626* (2006.01)
  *C04B 35/645* (2006.01)
  *H01J 37/32* (2006.01)
  *B25J 19/00* (2006.01)
  *B25J 15/00* (2006.01)
  *H01L 21/687* (2006.01)
  *B25J 9/00* (2006.01)
  *B25J 11/00* (2006.01)

(52) U.S. Cl.
  CPC ....... *B25J 15/0085* (2013.01); *B25J 19/0054* (2013.01); *C04B 35/117* (2013.01); *C04B 35/6261* (2013.01); *C04B 35/6264* (2013.01); *C04B 35/62655* (2013.01); *C04B 35/645* (2013.01); *H01J 37/32* (2013.01); *H01J 37/3255* (2013.01); *H01J 37/32477* (2013.01); *H01J 37/32697* (2013.01); *H01J 37/32715* (2013.01); *H01L 21/6831* (2013.01); *H01L 21/68757* (2013.01); *C04B 2235/00* (2013.01); *C04B 2235/3217* (2013.01); *C04B 2235/3826* (2013.01); *C04B 2235/3834* (2013.01); *C04B 2235/40* (2013.01); *C04B 2235/5445* (2013.01); *C04B 2235/5454* (2013.01); *C04B 2235/606* (2013.01); *C04B 2235/6562* (2013.01); *C04B 2235/661* (2013.01); *C04B 2235/781* (2013.01); *C04B 2235/85* (2013.01); *C04B 2235/87* (2013.01); *H01J 2237/0041* (2013.01)

(58) Field of Classification Search
  CPC . B25J 15/0085; B25J 19/0054; C04B 35/117; C04B 35/6261; C04B 35/6264; C04B 35/62655; C04B 35/645; H01J 37/32; H01J 37/32477; H01J 37/3255; H01J 37/32697; H01J 37/32715
  See application file for complete search history.

(56) References Cited

FOREIGN PATENT DOCUMENTS

| | | | |
|---|---|---|---|
| JP | 05-178657 | A | 7/1993 |
| JP | 05-295352 | A | 11/1993 |
| JP | H05295352 | * | 11/1993 |
| JP | 06-219828 | A | 8/1994 |
| JP | 08-267305 | A | 10/1996 |
| JP | 09-283606 | A | 10/1997 |
| JP | 4744855 | B | 8/2011 |
| JP | 2012-216816 | A | 11/2012 |

* cited by examiner

CERAMIC MATERIAL AND ELECTROSTATIC CHUCK DEVICE

TECHNICAL FIELD

The present invention relates to a ceramic material and an electrostatic chuck device.

This application is a U.S. National Stage Application under 35 U.S.C. § 371 of International Patent Application No. PCT/JP2017/002934 filed on Jan. 27, 2017, which claims the benefit of priority to Japanese Patent Application No. 2016-013843 filed on Jan. 27, 2016 and Japanese Patent Application No. 2016-065345 filed on Mar. 29, 2016, the disclosures of all of which are hereby incorporated by reference in their entireties. The International Application was published in Japanese on Aug. 3, 2017 as WO 2017/131159.

BACKGROUND

In recent years, in a semiconductor manufacturing apparatus which performs a plasma process, an electrostatic chuck device capable of easily mounting and fixing a plate-shaped sample (a wafer) to a sample stage and capable of maintaining a temperature of the wafer at a desired temperature has been used. The electrostatic chuck device is provided with an electrostatic attraction electrode that generates an electrostatic force (Coulomb's force) between a base having one principal surface which is a mounting surface on which the wafer is mounted, and a wafer mounted on the mounting surface (for example, Patent Literature No. 1).

In such an electrostatic chuck device, in recent years, a demand for fixing and using the plate-shaped sample with a higher attraction force than in the related art has increased. In contrast, if a high voltage is applied to increase the attraction force, insulation failure in the electrostatic chuck device occurs during use, causing a problem such as breakage due to electric discharge, for example.

With regard to such a problem, in recent years, an increase in the withstand voltage of a ceramic material which is used for an electrostatic chuck device has been attempted. For example, in Patent Literature No. 2, materials with dielectric breakdown strength exceeding 100 kV/mm have been proposed.

CITATION LIST

Patent Literature

[Patent Literature No. 1] Japanese Patent No. 4744855
[Patent Literature No. 2] Japanese Laid-open Patent Publication No. 2012-216816

SUMMARY OF INVENTION

Technical Problem $Al_2O_3$—SiC, which is a ceramic composite sintered body, is known as the material for forming a base of an electrostatic chuck device. However, in the electrostatic chuck device of the related art, which uses $Al_2O_3$—SiC, the electrostatic chuck device is required to have higher durability as miniaturization or three-dimensional formation of a semiconductor technique progresses and use conditions of a semiconductor manufacturing apparatus and an electrostatic chuck device which is used for the semiconductor manufacturing apparatus become more severe. For this reason, it has been demanded to increase the withstand voltage of the ceramic material which is used for the electrostatic chuck device.

The present invention has been made in view of such circumstances and has an object to provide a ceramic material which is suitably used for an electrostatic chuck device and has excellent durability. Further, the present invention has an object to provide an electrostatic chuck device using such a ceramic material.

Solution to Problem

In SiC, a large number of crystal structures are known, and silicon carbide having a 3C type (zincblende type) crystal structure in a cubic system, silicon carbide having a wurtzite type crystal structure in a hexagonal system of a 4H type, a 6H type, or the like, and silicon carbide having a 15R type crystal structure in a rhombohedral system can be given as an example. Among these, the silicon carbide having a 3C type crystal structure is referred to as "β-SiC".

As a result of a study on a base broken in use of an electrostatic chuck device, which was performed by the inventors of the present invention, it was found that in many cases, breakage occurs with a α-SiC crystal grain included in $Al_2O_3$—SiC configuring the base as the starting point.

In order to solve the above problem, a ceramic material of a first embodiment of the present invention provides a composite sintered body (a ceramic material) for an electrostatic chuck, which is a composite sintered body (a ceramic material) including an insulating ceramic and silicon carbide, in which crystal grains of the silicon carbide are dispersed in at least one selected from the group consisting of a crystal grain boundary and a crystal grain of a main phase formed by sintering crystal grains of the insulating ceramic, a content of crystal grains having a β-SiC type crystal structure is more than 60% by volume with respect to a total amount of the crystal grains of the silicon carbide, the composite sintered body includes pores which are present in a crystal grain boundary, and a ratio of apparent density of the composite sintered body to hypothetical true density when the composite sintered body is assumed not to include the pores is 97% or more.

In one aspect of the present invention, a grain diameter obtained from an X-ray diffraction result of the crystal grain of the silicon carbide may be 50 nm or more.

In one aspect of the present invention, the ceramic material may include a portion in which the crystal grains having the β-SiC type crystal structure is sintered with each other.

In one aspect of the present invention, the insulating ceramic may be aluminum oxide.

One aspect of the present invention provides a composite sintered body for an electrostatic chuck, which is a composite sintered body of aluminum oxide and silicon carbide, in which crystal grains of the silicon carbide are dispersed in a crystal grain boundary and a crystal grain of a main phase formed by sintering crystal grains of the aluminum oxide, and in an X-ray diffraction pattern obtained by irradiating a surface of the composite sintered body with CuKα rays, a ratio (I1/I3) of a peak (I1) which is observed around 2θ=33.7 degrees and a peak (I3) which is observed around 2θ=35.8 degrees is 0.05 or less, and in the X-ray diffraction pattern, a ratio (I2/I3) of a peak (I2) which is observed around 2θ=34.1 degrees and the peak (I3) which is observed around 2θ=35.8 degrees is 0.01 or less.

One aspect of the present invention provides an electrostatic chuck device including: a base using the above-described composite sintered body for an electrostatic chuck as a forming material and having one principal surface which is a mounting surface on which a plate-shaped sample is mounted; and an electrostatic attraction electrode provided on a side opposite to the mounting surface of the base or in an interior of the base.

Further, the inventors of the present invention performed a study on an increase in the withstand voltage of a material which is used for an electrostatic chuck device, according to a different way of thinking from that in Patent Literature No, 2 described above.

The inventors thought that a cause of insulation failure or electric discharge is due to plasma which is used for the use environment of the electrostatic chuck device. That is, the electrostatic chuck device is exposed to plasma, whereby electric charges are accumulated in a ceramic material which is used for the electrostatic chuck device and the potential of the ceramic material is increased. In this way, it was thought that the insulation of the ceramic material was destroyed, causing insulation failure or electric discharge.

Therefore, the inventors though that the durability of the electrostatic chuck device can be increased by using, as a ceramic material which is used for the electrostatic chuck device, a material having suitable insulating properties that can be used as the electrostatic chuck device and capable of gradually discharging electric charges accumulated by plasma.

That is, in order to solve the above problem, a ceramic material of a second embodiment of the present invention provides a ceramic material satisfying the following (i) and (ii):

(i) when a test piece of the ceramic material having a thickness of 0.3 mm is sandwiched between electrodes having the same diameter of 20 mm and measured at a voltage increase rate of 1000 V/sec. according to a short time test prescribed in JIS C2110-2, a voltage value is 10 kV/mm or more when a current value flowing through the test piece exceeds 1 µA; and (ii) when the current value flowing through the test piece is measured every 0.1 second under the same condition as the above (i), with respect to a time point when the current value increases over 10 µA per 0.1 second, a current value corresponding to a voltage value 0.1 second before the time point is 5 µA or more.

In one aspect of the present invention, the ceramic material may be a sintered body.

In one aspect of the present invention, the ceramic material may be a composite sintered body including an insulating ceramic and silicon carbide.

In one aspect of the present invention, the insulating ceramic may be aluminum oxide.

In one aspect of the present invention, a content of a metal impurity other than aluminum and silicon may be 1000 ppm or less.

Further, one aspect of the present invention provides an electrostatic chuck device including: a base using the above-described ceramic material as a forming material and having one principal surface which is a mounting surface on which a plate-shaped sample is mounted; and an electrostatic attraction electrode provided on a side opposite to the mounting surface of the base or in an interior of the base.

Advantageous Effects of Invention

According to the first embodiment of the present invention, it is possible to provide a composite sintered body for an electrostatic chuck, which is not easily broken even if it is exposed to high-power plasma. Further, it is possible to provide an electrostatic chuck device using such a composite sintered body for an electrostatic chuck.

According to the second embodiment of the present invention, it is possible to provide a ceramic material that is suitably used for an electrostatic chuck device and has excellent durability. Further, it is possible to provide an electrostatic chuck device using such a ceramic material.

DESCRIPTION OF EMBODIMENTS

Figure 1:
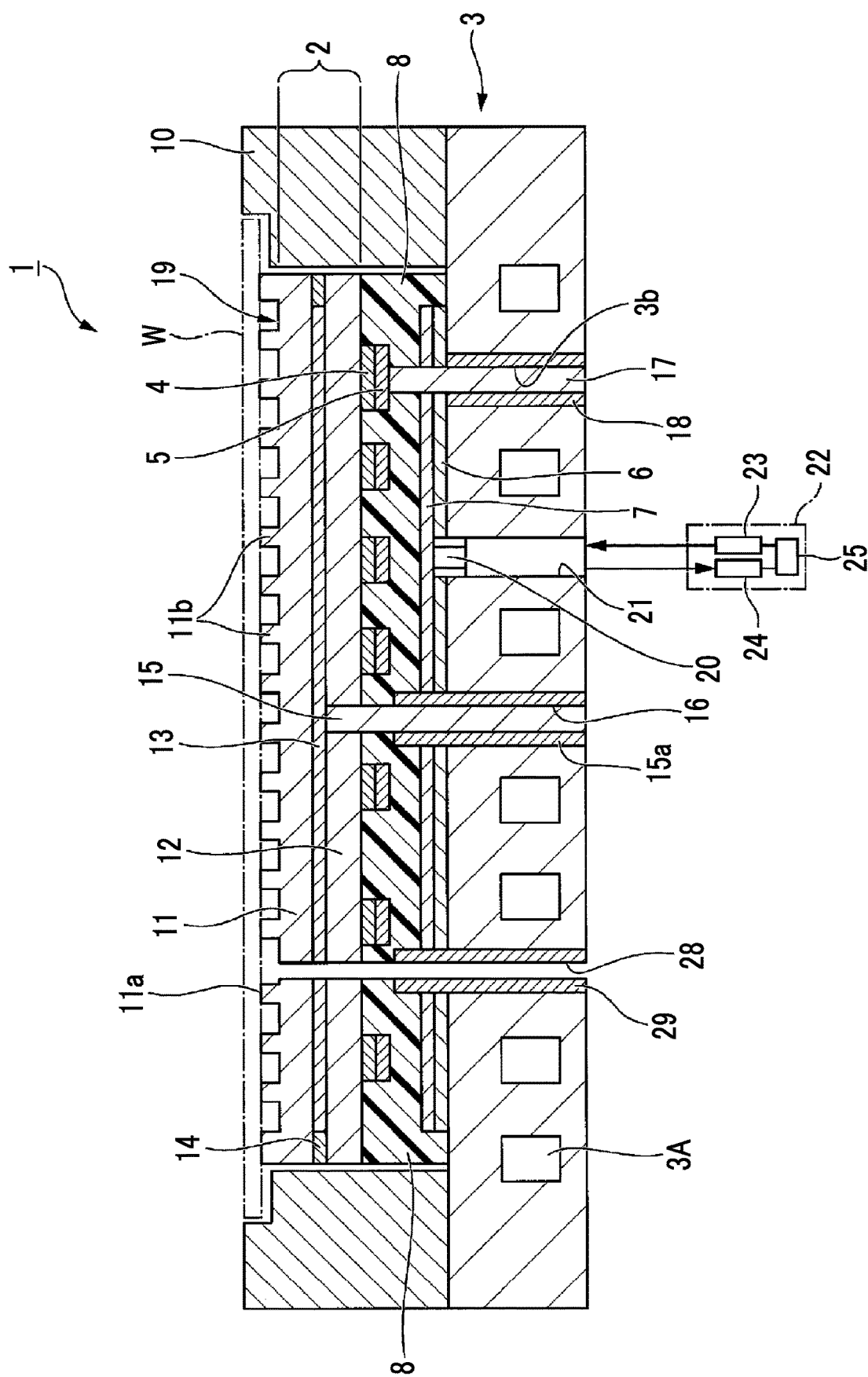
FIG. 1 is a sectional view showing an electrostatic chuck device according to the present embodiment.
Figure 2:
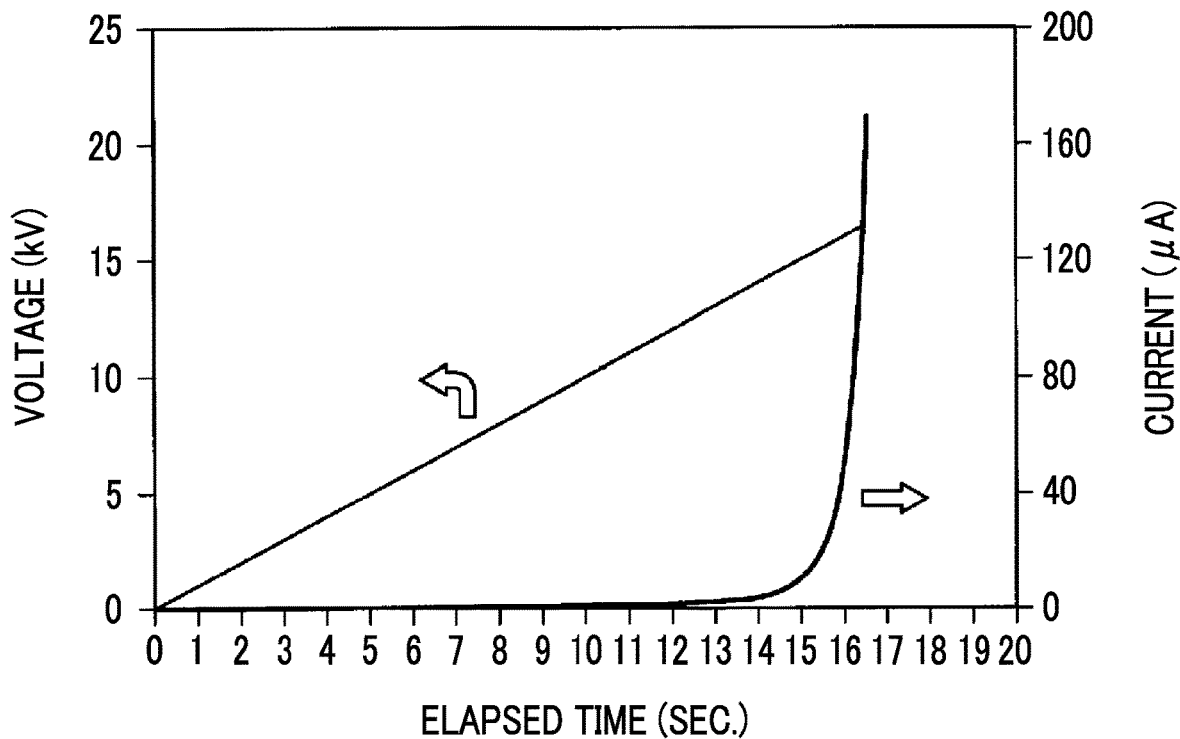
FIG. 2 is a graph showing measurement results of Example 1.
Figure 3:
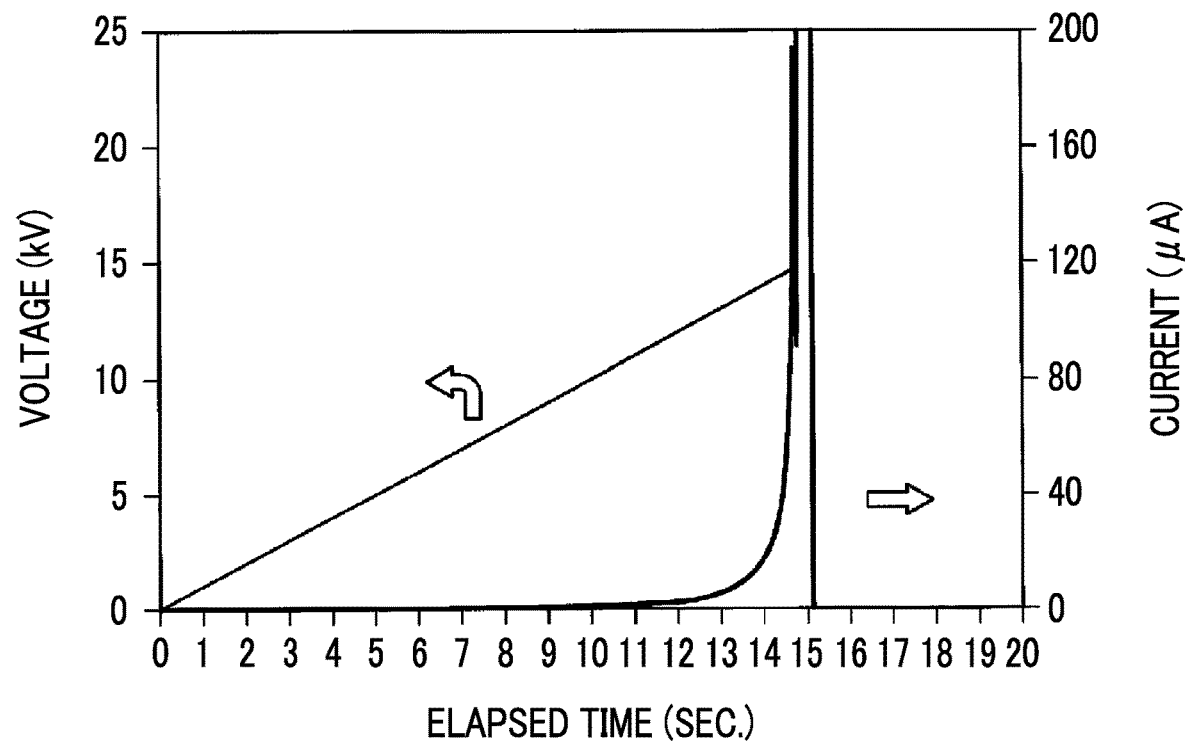
FIG. 3 is a graph showing measurement results of Example 2.
Figure 4:
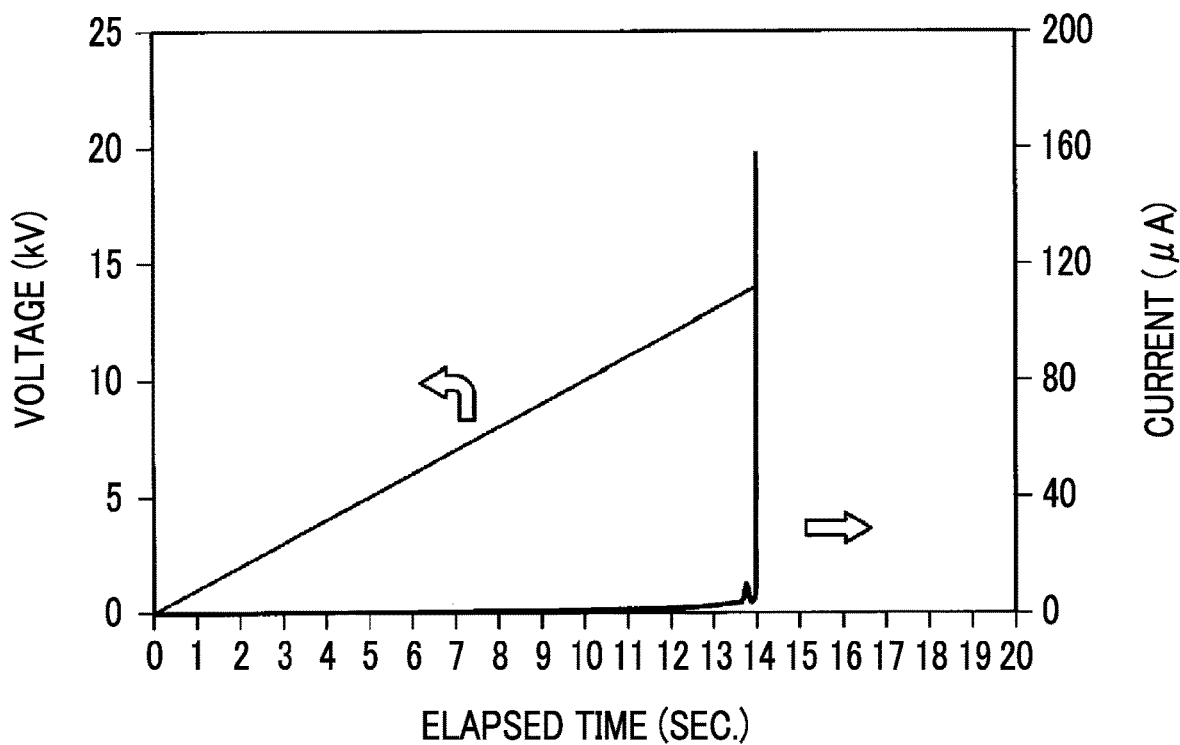
FIG. 4 is a graph showing measurement results of Comparative Example 1.
Figure 5:
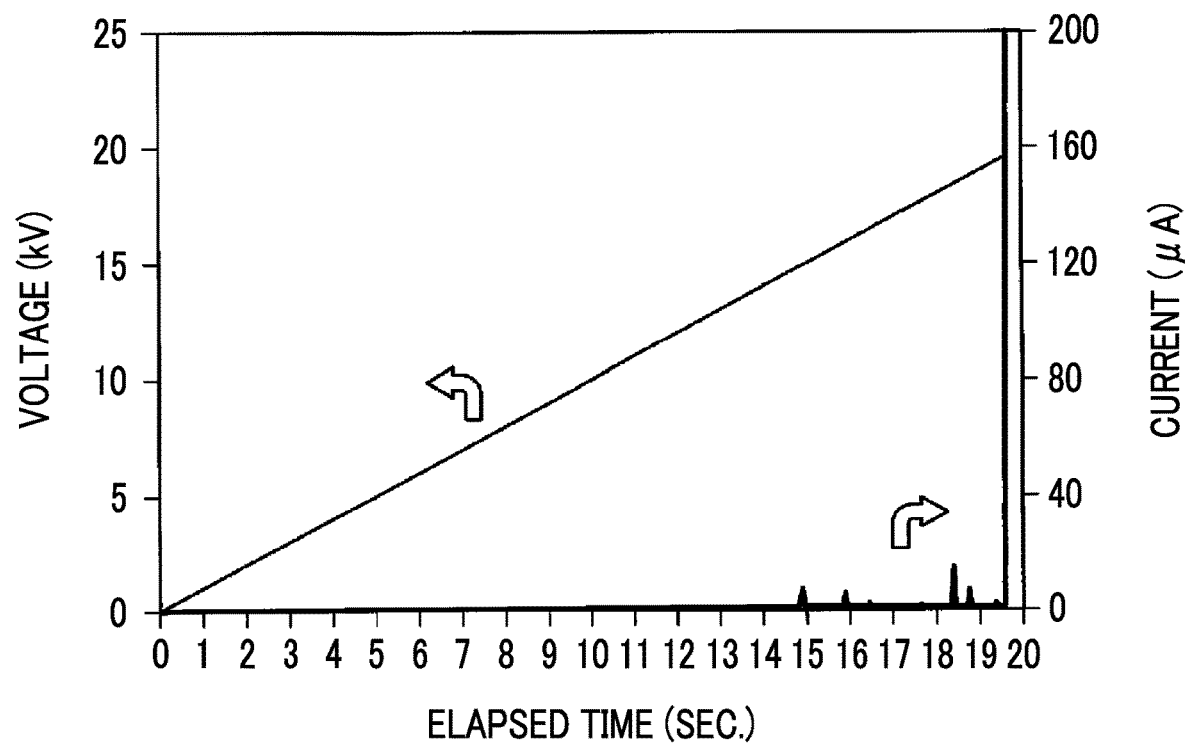
FIG. 5 is a graph showing measurement results of Comparative Example 2.

A ceramic material of a first embodiment of the present invention is a composite sintered body including an insulating ceramic and silicon carbide, in which crystal grains of the silicon carbide are dispersed in at least one selected from the group consisting of a crystal grain boundary and a crystal grain of a main phase formed by sintering crystal grains of the insulating ceramic, a content of crystal grains having a β-SiC type crystal structure is more than 60% by volume with respect to a total amount of the crystal grains of the silicon carbide, the composite sintered body includes pores which are present in a crystal grain boundary, and a ratio of apparent density of the composite sintered body to hypothetical true density when the composite sintered body is assumed not to include the pores is 97% or more.

A ceramic material of a second embodiment of the present invention satisfies the following (i) and (ii):

(i) when a test piece of the ceramic material having a thickness of 0.3 mm is sandwiched between electrodes having the same diameter of 20 mm and measured at a voltage increase rate of 1000 V/sec. according to a short time test prescribed in JIS C2110-2, a voltage value is 10 kV/mm or more when a current value flowing through the test piece exceeds 1 µA; and (ii) when the current value flowing through the test piece is measured every 0.1 second under the same condition as the above (i), with respect to a time point when the current value increases over 10 µA per 0.1 second, a current value corresponding to a voltage value 0.1 second before the above time point is 5 µA or more.

In this embodiment, an expression "according to a short time test prescribed in JIS C2110-2" means that an electrode having the same diameter of 20 mm is used instead of an electrode having a diameter of 25 mm prescribed in the above standard and other conditions conform to the conditions of the above standard.

Such a ceramic material is suitably used mainly as a material for forming an electrostatic chuck device. For this reason, in the following description, after each configuration of an electrostatic chuck device of an embodiment of the present invention, to which each of the ceramic materials of the first and second embodiments of the present invention is applied, is described, a ceramic material of each embodiment will be described.

In this specification, each term is set to represent the following meaning.

A term "critical current" refers to a current corresponding to a voltage value 0.1 sec. before the time when a current value flowing through a test piece of a ceramic material increases over 10 μA per 0.1 sec. when the current value is measured every 0.1 sec.

For example, when the current value flowing through the test piece is measured at times t1, t2, t3, . . . (an interval between the respective times is 0.1 sec.), in a case where an increment of the current value does not exceed 10 μA in a period from t1 to t2 and the increment of the current value exceeds 10 μA in a period from t2 to t3, it becomes as follows. That is, a "time when the current value increases over 10 μA per 0.1 sec." is t3, and the "critical current" is a current value corresponding to a voltage value 0.1 sec. before t3, that is, a current at t2. A critical current value is a current value at t2.

A term "withstand voltage" refers to a voltage value when the current value flowing through the test piece of the ceramic material exceeds 1 μA.

If the above terms are used, the above (i) and (ii) defined for the ceramic material of this embodiment can also be expressed as follows.

(i) When a test piece of a ceramic material having a thickness of 0.3 mm is sandwiched between electrodes having the same diameter of 20 mm and measured at a voltage increase rate of 1000 V/sec. according to a short time test prescribed in JIS C2110-2, the withstand voltage of the test piece of the ceramic material is 10 kV/mm or more.

(ii) In the test which is performed under the same condition as the above (i), the critical current value of the test piece of the ceramic material is 5 μA or more.

A term "dielectric breakdown" refers to deterioration of the irreversible insulation property of a ceramic material. In this respect, even if the insulation property is lowered due to electrification of the test piece of the ceramic material during the test, in a case where the test piece discharges electric charges, so that the insulation property of the test piece is recovered to a state before the test, it does not indicate "deterioration of the irreversible insulation property", and therefore, it is determined that dielectric breakdown has not occurred. Further, similarly, even if the test piece discharges electric charges, so that the insulation property of the test piece is recovered, in a case where it is not recovered to a state before the test, it is determined that dielectric breakdown has occurred by a difference in insulation property between the state before the test and the state after the electric charge discharge.

A term "insulation failure" refers to a state where with respect to an electrostatic chuck device using the ceramic material of this embodiment as a forming material thereof, it cannot be used as an electrostatic chuck device as a result of progress of dielectric breakdown of a member using a ceramic material as a forming material thereof.

An expression "electric discharge of ceramic material" refers to electric discharge which occurs from a ceramic material to a space. Electric discharge which is thought to occur between crystal grains in the ceramic material according to dielectric breakdown in the ceramic material is not included in the electric discharge of the ceramic material.

[Electrostatic Chuck Device]

Hereinafter, an electrostatic chuck device according to this embodiment will be described with reference to FIG. 1.

In all of the following drawings, dimensions, a ratio, or the like of each constitute element is appropriately changed in order to make the drawings easy to see.

FIG. 1 is a sectional view showing the electrostatic chuck device of this embodiment. An electrostatic chuck device 1 of this embodiment is provided with: an electrostatic chuck part 2 having a disk shape when viewed in a plan view and having a mounting surface on the one principal surface (upper surface) side; and a thick temperature adjusting base part 3 which has a disk shape when viewed in a plan view and is provided below the electrostatic chuck part 2 to adjust the temperature of the electrostatic chuck part 2 to a desired temperature. Further, the electrostatic chuck part 2 and the temperature adjusting base part 3 are bonded to each other through an adhesive layer 8 provided between the electrostatic chuck part 2 and the temperature adjusting base part 3.

Hereinafter, these constituent elements will be described in order.

(Electrostatic Chuck Part)

The electrostatic chuck part 2 has a mounting plate 11 having an upper surface serving as a mounting surface 11a on which a plate-shaped sample W such as a semiconductor wafer is mounted, a supporting plate 12 which is integrated with the mounting plate 11 and supports the bottom portion side of the mounting plate 11, an electrostatic attraction electrode 13 provided between the mounting plate 11 and the supporting plate 12, and an insulating material layer 14 which insulates the surroundings of the electrostatic attraction electrode 13. Each of the mounting plate 11 and the supporting plate 12 corresponds to a "base" in the present invention.

The mounting plate 11 and the supporting plate 12 are disk-shaped members in which the shapes of superimposed surfaces are the same. Each of the mounting plate 11 and the supporting plate 12 is made of a ceramic sintered body having mechanical strength and durability against corrosive gas and plasma thereof. The mounting plate 11 and the supporting plate 12 will be described in detail later.

A plurality of projection portions 11b each having a diameter smaller than the thickness of the plate-shaped sample are formed at predetermined intervals on the mounting surface 11a of the mounting plate 11, and the projection portions 11b support the plate-shaped sample W.

The thickness of the entirety including the mounting plate 11, the supporting plate 12, the electrostatic attraction electrode 13, and the insulating material layer 14, that is, the thickness of the electrostatic chuck part 2 is 0.7 mm or more and 5.0 mm or less as an example.

For example, if the thickness of the electrostatic chuck part 2 falls below 0.7 mm, it becomes difficult to secure the mechanical strength of the electrostatic chuck part 2. If the thickness of the electrostatic chuck part 2 exceeds 5.0 mm, the thermal capacity of the electrostatic chuck part 2 becomes larger, and thus the thermal responsiveness of the plate-shaped sample W placed thereon does not deteriorate, and due to an increase in the heat transfer in a lateral direction of the electrostatic chuck part, it becomes difficult to maintain the in-plane temperature of the plate-shaped sample W at a desired temperature pattern. The thickness of each part described here is an example and is not limited to the above-mentioned range.

The electrostatic attraction electrode 13 is used as an electrostatic chucking electrode for generating electric charges and fixing the plate-shaped sample W with an electrostatic attraction force, and the shape or the size thereof is appropriately adjusted according to the use thereof.

The electrostatic attraction electrode 13 is preferably formed of conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or an yttrium oxide-molybdenum ($Y_2O_3$—Mo) conductive composite sintered body, or high melting point metal such as tungsten (W), tantalum (Ta), or molybdenum (Mo).

The thickness of the electrostatic attraction electrode 13 is not particularly limited. However, for example, a thickness of 0.1 μm or more and 100 μm or less can be selected, and a thickness of 5 μm or more and 20 μm or less is more preferable.

If the thickness of the electrostatic attraction electrode 13 falls below 0.1 μm, it becomes difficult to secure sufficient electrical conductivity. If the thickness of the electrostatic attraction electrode 13 exceeds 100 μm, cracking easily occurs in the joint interfaces between the electrostatic attraction electrode 13, and the mounting plate 11 and the supporting plate 12 due to a difference in coefficient of thermal expansion between the electrostatic attraction electrode 13, and the mounting plate 11 and the supporting plate 12.

The electrostatic attraction electrode 13 having such a thickness can be easily formed by a film formation method such as a sputtering method or a vapor deposition method, or a coating method such as a screen printing method.

The insulating material layer 14 surrounds the electrostatic attraction electrode 13 to protect the electrostatic attraction electrode 13 from corrosive gas and plasma thereof, and joins and integrates a boundary portion between the mounting plate 11 and the supporting plate 12, that is, an outer peripheral portion region except for the electrostatic attraction electrode 13. The insulating material layer 14 is formed of an insulating material having the same composition or the same main component as the material configuring the mounting plate 11 and the supporting plate 12.

(Temperature Adjusting Base Part)

The temperature adjusting base part 3 is for adjusting the temperature of the electrostatic chuck part 2 to a desired temperature and is a thick disk-shaped member. As the temperature adjusting base part 3, for example, a liquid-cooling base or the like, in which a flow path 3A for circulating a coolant in the interior thereof is formed, is suitable.

As a material configuring the temperature adjusting base part 3, as long as it is metal which has excellent thermal conductivity, electrical conductivity, and workability, or a compound material which includes the metal, there is no particular limitation. For example, aluminum (Al), an aluminum alloy, copper (Cu), a copper alloy, stainless steel (SUS), or the like is suitably used. It is preferable that at least the surface which is exposed to plasma, of the temperature adjusting base part 3, is subjected to alumite treatment or has an insulating film such as an aluminum oxide ($Al_2O_3$, alumina) formed thereon. Hereinafter, in this specification, the aluminum oxide is represented as $Al_2O_3$.

An insulating plate 7 is bonded to the upper surface side of the temperature adjusting base part 3 through an adhesion layer 6. The adhesion layer 6 is made of a sheet-shaped or film-shaped adhesive resin having heat resistance and insulating properties, such as polyimide resin, silicone resin, or epoxy resin. The adhesion layer is formed in a thickness in a range of about 5 μm to 100 μm, for example. The insulating plate 7 is made of a thin plate, a sheet, or a film of heat-resistant resin such as polyimide resin, epoxy resin, or acrylic resin.

The insulating plate 7 may be an insulating ceramic plate instead of a resin sheet, or may be a thermally sprayed film having insulating properties, such as $Al_2O_3$.

(Focus Ring)

A focus ring 10 is a member that has a ring shape when viewed in a plan view and is placed on a peripheral portion of the temperature adjusting base part 3. The focus ring 10 uses, for example, a material having electrical conductivity equivalent to that of a wafer which is mounted on the mounting surface, as a forming material thereof. By disposing the focus ring 10, it is possible to make an electrical environment with respect to plasma substantially coincide with that in the wafer at a peripheral portion of the wafer, and thus it is possible to make it difficult for a difference or bias in plasma treatment to occur between the central portion and the peripheral portion of the wafer.

(Other Members)

A power supply terminal 15 for applying a direct-current voltage to the electrostatic attraction electrode 13 is connected to the electrostatic attraction electrode 13. The power supply terminal 15 is inserted into a through-hole 16 penetrating the temperature adjusting base part 3, the adhesive layer 8, and the supporting plate 12 in a thickness direction. An insulator 15a having insulating properties is provided on the outer periphery side of the power supply terminal 15, and the power supply terminal 15 is insulated from the temperature adjusting base part 3 made of metal, by the insulator 15a.

In the drawing, the power supply terminal 15 is shown as an integral member. However, the power supply terminal 15 may be configured by electrically connecting a plurality of members. The power supply terminal 15 is inserted into the temperature adjusting base part 3 and the supporting plate 12, which have different coefficients of thermal expansion, and therefore, it is preferable that, for example, a portion which is inserted into the temperature adjusting base part 3 and a portion which is inserted into the supporting plate 12 are made of different materials.

As the material of the portion (extraction electrode) connected to the electrostatic attraction electrode 13 and inserted into the supporting plate 12, of the power supply terminal 15, as long as it is a conductive material having excellent heat resistance, there is no particular limitation. However, a material having a coefficient of thermal expansion which is close to the coefficients of thermal expansion of the electrostatic attraction electrode 13 and the supporting plate 12 is preferable. For example, it is made of a conductive ceramic material such as $Al_2O_3$—TaC.

The portion inserted into the temperature adjusting base part 3, of the power supply terminal 15, is made of a metal material such as tungsten (W), tantalum (Ta), molybdenum (Mo), niobium (Nb), or a Kovar alloy, for example.

It is favorable if these two members are connected to each other with a silicone-based conductive adhesive having flexibility and resistance to electricity.

A heater element 5 is provided on the lower surface side of the electrostatic chuck part 2. The heater element 5 is obtained, for example, by processing a nonmagnetic metal thin plate, for example, a titanium (Ti) thin plate, a tungsten (W) thin plate, a molybdenum (Mo) thin plate, or the like, having a constant thickness of 0.2 mm or less, preferably about 0.1 mm, into a desired heater shape, for example, a shape in which a band-like conductive thin plate meanders and the entire contour is an annular shape, by a photolithography method or laser processing.

The heater element 5 may be provided by bonding a nonmagnetic metal thin plate to the electrostatic chuck part 2 and then processing and forming the nonmagnetic metal thin plate on the surface of the electrostatic chuck part 2, or may be provided by transfer-printing the heater element 5 processed and formed at a position different from the electrostatic chuck part 2 onto the surface of the electrostatic chuck part 2.

The heater element 5 is bonded and fixed to the bottom surface of the supporting plate 12 by an adhesion layer 4 made of a sheet-shaped or film-shaped silicone resin or acrylic resin having a uniform thickness and having heat resistance and insulating properties.

A power supply terminal 17 for supplying electric power to the heater element 5 is connected to the heater element 5. As the material configuring the power supply terminal 17, a material equivalent to the material configuring the power supply terminal 15 described above can be used. The power supply terminal 17 is provided so as to pass through a through-hole 3b formed in the temperature adjusting base part 3.

Further, a temperature sensor 20 is provided on the lower surface side of the heater element 5. In the electrostatic chuck device 1 of this embodiment, an installation hole 21 is formed so as to penetrate the temperature adjusting base part 3 and the insulating plate 7 in the thickness direction, and the temperature sensor 20 is installed at the uppermost portion of the installation hole 21. It is preferable that the temperature sensor 20 is installed at a position as close to the heater element 5 as possible. Therefore, the installation hole 21 may be formed to extend so as to protrude further toward the adhesive layer 8 side from the structure shown in the drawing such that the temperature sensor 20 and the heater element 5 are brought closer to each other.

The temperature sensor 20 is, for example, a fluorescent emission type temperature sensor in which a phosphor layer is formed on the upper surface side of a rectangular parallelepiped-shaped light transmission body made of quartz glass as an example, and the temperature sensor 20 is bonded to the lower surface of the heater element 5 by a silicone resin-based adhesive or the like having translucency and heat resistance.

The phosphor layer is made of a material that generates fluorescence in response to heat input from the heater element 5. As the material for forming the phosphor layer, as long as it is a material generating fluorescence in response to heat generation, it can be selected from a wide variety of fluorescent materials. As the material for forming the phosphor layer, a fluorescent material to which a rare earth element having an energy level suitable for light emission is added, a semiconductor material such as AlGaAs, a metal oxide such as a magnesium oxide, and a mineral such as ruby or sapphire can be given as an example, and a material appropriately selected from these materials can be used.

The temperature sensor 20 corresponding to the heater element 5 is provided at an appropriate position which does not interfere with the power supply terminals or the like and is in a circumferential direction of the lower surface of the heater element 5.

A temperature measurement part 22 which measures the temperature of the heater element 5 from the fluorescence of the temperature sensor 20 is configured of, for example, an excitation unit 23 which irradiates the phosphor layer with excitation light on the outside (the lower side) of the installation hole 21 of the temperature adjusting base part 3, a fluorescence detector 24 which detects the fluorescence emitted from the phosphor layer, and a control unit 25 which controls the excitation unit 23 and the fluorescence detector 24 and calculates the temperature of a main heater on the basis of the fluorescence.

Further, the electrostatic chuck device 1 has a pin insertion hole 28 provided so as to penetrate from the temperature adjusting base part 3 to the mounting plate 11 in the thickness direction thereof. A lift pin for removal of the plate-shaped sample is inserted into the pin insertion hole 28. A tubular insulator 29 is provided at an inner peripheral portion of the pin insertion hole 28.

Further, the electrostatic chuck device 1 has a gas hole (not shown) provided so as to penetrate from the temperature adjusting base part 3 to the mounting plate 11 in the thickness direction thereof. The gas hole can adopt the same configuration as the pin insertion hole 28, for example. Cooling gas for cooling the plate-shaped sample W is supplied to the gas hole. The cooling gas is supplied to grooves 19 which are formed between the plurality of projection portions 11b on the upper surface of the mounting plate 11 through the gas hole, and cools the plate-shaped sample W.

The electrostatic chuck device 1 has the configuration as described above.

Next, the base (each of the mounting plate 11 and the supporting plate 12) of an embodiment of the present invention will be described in detail.

The mounting plate 11 and the supporting plate 12 of this embodiment use a composite sintered body of insulating ceramic and silicon carbide (SiC) as a forming material thereof. The material for forming the mounting plate 11 and the supporting plate 12 is a composite sintered body for an electrostatic chuck (hereinafter referred to as a composite sintered body or simply as a ceramic material) in the present invention. Hereinafter, in this specification, the silicon carbide is represented as "SiC".

[Ceramic Material (Composite Sintered Body) Part 1]

As the insulating ceramic which is included in the composite sintered body of the first embodiment of the present invention, an oxide made of only one kind selected from the group consisting of $Al_2O_3$, yttrium oxide ($Y_2O_3$), aluminum nitride (AlN), silicon nitride ($Si_3N_4$), mullite ($3Al_2O_3 \cdot 2SiO_2$), magnesium oxide (MgO), magnesium fluoride ($MgF_2$), hafnium oxide ($HfO_2$), scandium oxide ($Sc_2O_3$), neodymium oxide ($Nd_2O_3$), niobium oxide ($Nb_2O_5$), samarium oxide ($Sm_2O_3$), ytterbium oxide ($Yb_2O_3$), erbium oxide ($Er_2O_3$), and cerium oxide ($CeO_2$), or a mixture obtained by mixing two or more kinds can be exemplified.

Further, as the insulating ceramic which is included in the composite sintered body, a double oxide which is an oxide containing two or more kinds of metal ions may be used. As such a double oxide, yttrium aluminum garnet (YAG: $3Y_2O_3 \cdot 5Al_2O_3$) can be exemplified.

Among these, in particular, $Al_2O_3$ is inexpensive, has excellent heat resistance or corrosion resistance, and also provides excellent mechanical properties of a composite sintered body, and therefore, it is also suitably used for the composite sintered body of this embodiment.

Further, in a case where it is desired to use an insulating ceramic with a low aluminum content, yttrium oxide ($Y_2O_3$) can also be used. Further, in a case where it is desired to further enhance corrosion resistance than in $Al_2O_3$, $Y_2O_3$, yttrium aluminum garnet (YAG: $3Y_2O_3 \cdot 5Al_2O_3$), or the like can also be used.

In this embodiment, an example in which $Al_2O_3$ is used as the insulating ceramic is described.

SiC which is included in the composite sintered body has crystal grains having a α-SiC type crystal structure (hereinafter referred to as α-SiC grains) and crystal grains having a β-SiC type crystal structure (hereinafter referred to as β-SiC grains).

In the composite sintered body configuring the base of this embodiment, crystal grains of SiC are dispersed in the crystal grain boundary and the interior of the crystal grain of a main phase formed by sintering crystal grains of $Al_2O_3$ which is the insulating ceramic.

The content rate of SiC in this composite sintered body is preferably 4% by volume or more and 23% by volume or less, more preferably 5% by volume or more and 20% by volume or less, and further preferably 6% by volume or more and 12% by volume or less.

Here, the reason why the content rate of SiC is set to be in the above range is because in the content rate of SiC of less than 4% by volume, the amount of SiC becomes too small with respect to the insulating ceramic, so that it becomes difficult to obtain the effect of improving adsorption/desorption characteristics or thermal conductivity in a case of using it as an electrostatic chuck by addition of SiC. On the other hand, the reason is because if the content rate of conductive particles exceeds 23% by mass, the amount of the conductive particles becomes too large with respect to the insulating material, so that it becomes difficult to obtain withstand voltage characteristics necessary for use as an electrostatic chuck.

The average particle diameter of the insulating ceramic in the composite sintered body is preferably 2 μm or less. If the average particle diameter of the $Al_2O_3$ particles exceeds 2 μm, in a case where a base material of the electrostatic chuck device is manufactured using this composite sintered body, the upper surface of the base material on the side on which the plate-shaped sample is mounted is easily etched by plasma. For this reason, sputter marks are formed on the upper surface of the base material, and thus there is a concern that they may cause contamination of an object to be attracted, such as a silicon wafer.

In the SiC particles in the composite sintered body, fine SiC particles having a particle diameter of 0.04 μm or less are included preferably in an amount of 0.001% by volume or more and more preferably in an amount of 1% by volume or more with respect to the entire composite sintered body. The SiC particles having a particle diameter of 0.04 μm or less are included in an amount of 0.001% by volume or more, so that the average interval in which the SiC particles having a particle diameter of 0.04 μm or less are present becomes 1.5 μm or less. For this reason, in a case where the average particle diameter of the insulating ceramic particles is 2 μm or less, one or more SiC particles having a particle diameter of 0.04 μm or less are present with respect to one insulating ceramic particle. In this manner, fine SiC particles are included in the composite sintered body, whereby in a case where the composite sintered body is used as a constituent member of the electrostatic chuck device, the effect of improving electrical characteristics such as attraction characteristics and dielectric properties is obtained.

Further, in the SiC particles in the composite sintered body, it is preferable that a particle diameter D10 in which a cumulative volume percentage in the volume particle size distribution of SiC particles is 10% by volume is 0.2 μm or less. In the composite sintered body, in a case where raw material particles become sintered polycrystalline bodies and are dispersed in the composite sintered body, a particle diameter is calculated using crystal grains of a sintered mass as the same particles.

Further, it is preferable that a particle diameter D90 in which a cumulative volume percentage in the volume particle size distribution of SiC particles is 90% by volume is 2 μm or less.

Further, it is preferable that the ratio (D90/D10) of D10 to D90 is 3.0 or more.

Further, it is preferable that the ratio (D90/D50) of D50 to D90 is 1.4 or more.

The particle diameter of the SiC particle is set to be within these ranges, whereby the dielectric breakdown of the electrostatic chuck device using the composite sintered body as the material for forming a constituent member can be gently progressed. For this reason, by measuring a current flowing through the constituent member or electric resistance before or during the use of the electrostatic chuck device using the composite sintered body as the material for forming the constituent member, it can be detected that insulation is gently broken, and thus it is possible to detect sign of dielectric breakdown. Therefore, a composite sintered body in which dielectric breakdown can be predicted in advance can be obtained.

When metal elements other than aluminum and silicon are assumed to be "metal impurities", the content rate of metal impurities in the composite sintered body is set to be preferably 1000 ppm or less and more preferably 100 ppm or less. Further, the metal impurity rate of each of SiC and the insulating ceramic which are included in the composite sintered body is set to be preferably 1000 ppm or less and more preferably 100 ppm or less. If the metal impurities are 1000 ppm or less, a possibility of contaminating a semiconductor wafer is lowered, and thus the temperature dependence of the electric resistance of the electrostatic chuck is reduced, which is preferable.

The withstand voltage of the composite sintered body is preferably 5 kV/mm or more, more preferably 8 kV/mm or more, and further preferably 10 kV/mm or more. In a case where a composite sintered body having withstand voltage of 5 kV/mm or more is used as a constituent member of a Coulomb's force type electrostatic chuck device, the composite sintered body can be used without dielectric breakdown when a voltage is applied thereto.

Further, in the composite sintered body configuring the base of this embodiment, β-SiC grains are included more than 60% by volume with respect to the entirety of the crystal grains of SiC. That is, the content rate of α-SiC grains is less than 40% by volume with respect to the entirety of the crystal grains of SiC.

It is preferable if the content rate of the β-SiC grains with respect to the entirety of the crystal grains of SiC is 80% by volume or more, 90% by volume or more is more preferable, and 95% by volume or more is further preferable. That is, it is preferable if the content rate of the α-SiC grains is 20% by volume or less with respect to the entirety of the crystal grains of SiC, 10% by volume or less is more preferable, and 5% by volume or less is further preferable.

Comparing α-SiC and β-SiC, α-SiC is thermodynamically stable. For this reason, it is known that β-SiC undergoes the phase transition to α-SiC due to various factors.

A temperature at which SiC undergoes a phase transition or a crystal form to be transitioned varies according to various factors such as impurities which are included in SiC or gas which is present in the surroundings. However, the phase transition from β-SiC to α-SiC occurs at a temperature of about 1750° C. or higher. $Al_2O_3$—SiC known in the related art is sintered at a high temperature in order to densify a sintered compact, and as a result, β-SiC undergoes the phase transition to α-SiC during sintering, and thus a large amount of α-SiC which causes a decrease in durability is included.

In contrast, in the composite sintered body configuring the base of this embodiment, it is manufactured by a manufacturing method which will be described later, whereby the phase transition from β-SiC to α-SiC is suppressed and the ratio of β-SiC is controlled to be more than 60% by volume. In this way, it is possible to obtain a composite sintered body for an electrostatic chuck, in which durability in a case of using it as an electrostatic chuck in a plasma processing apparatus is high.

As described above, if a composite sintered body which includes a large amount of α-SiC is used for a constituent member of an electrostatic chuck device, in a case where the electrostatic chuck device is used in a plasma processing apparatus, the constituent member often breaks with the α-SiC crystal grain as the starting point and has low durability. As a cause of such a phenomenon, the following is conceivable.

That is, in a case where a large amount of α-SiC is included in the composite sintered body, since α-SiC has lower electrical conductivity than β-SiC, local heat generation when a minute current flows in the sintered compact increases, and thus it is thought that dielectric breakdown easily occurs. Further, in a case where a large amount of α-SiC is included in the composite sintered body, electric charges are easily accumulated in the composite sintered body due to plasma irradiation, and electric discharge easily occurs. As a result, it is thought that breakage occurs due to the electric discharge.

Further, β-SiC has higher electrical conductivity than α-SiC, and therefore, by controlling the ratio of β-SiC to be more than 60% by volume, the effect of improving adsorption/desorption characteristics or electrical characteristics such as dielectric constant by adding SiC to the composite sintered body is enhanced. The adsorption/desorption characteristics are improved, whereby wear between a wafer and the base when using the composite sintered body as an electrostatic chuck and removing the wafer is reduced, and therefore, it is thought that there is also the effect of improving durability.

Further, in a case where α-SiC is included in SiC, it is preferable that the proportion of 4H-type α-SiC which is included in the entire SiC is set to be 30% by volume or less, it is more preferable that it is set to be 20% by volume or less, and it is further preferable that it is set to be 10% by volume or less. This is because the 4H-type SiC becomes a P-type semiconductor due to the presence of Al, or the like, so that the electrical conductivity of SiC is further reduced.

Further, in a case where α-SiC is included in SiC, it is preferable that the proportion of 6H-type α-SiC which is included in the entire SiC is set to be 20% by volume or less, it is more preferable that it is set to be 10% by volume or less, and it is further preferable that it is set to be 5% by volume or less.

The 6H-type SiC has lower electrical conductivity than β-SiC. Further, since the crystal grain of the 6H-type SiC has a larger aspect ratio than the crystal grain of the 4H-type SiC, it is easy to form a conductive path. For this reason, in a case where the 6H-type SiC is present, compared to a case where only the 4H-type SiC is present, the electrical characteristics or plasma resistance of the composite sintered body decreases by an amount corresponding to the formation of the conductive path by the 6H-type SiC having low electrical conductivity.

In this embodiment, the analysis of the crystal form of SiC (α-SiC, β-SiC) in the composite sintered body is performed by using the result obtained by measuring powder X-ray diffraction intensity and calculating it with the Ruska method (J. Mater. Sci., 14, 2013-2017 (1979)).

The existence of a large number of crystal structures of SiC is known as polymorphism. Polymorphisms appearing in a SiC material are usually 2H, 3C, 4H, 6H, and 15R. On the other hand, in crystal forms which are obtained by calculation, crystal forms having a low possibility of appearance due to a crystal form of a raw material which is used, a sintering temperature, or the like can be excluded. In a case where 3C or 6H crystal form is used for the crystal form of SiC powder which is used for a raw material and a sintering temperature is set to be in a range of 1500° C. to 2000° C., calculation may be performed with only three types of 3C, 4H, and 6H crystal systems being included. In a case where the peak of the polymorphism of SiC is at a position close to a peak caused by an insulating material, it is preferable that the peak is not used for the calculation and other peaks are used for the calculation.

In a case where it is assumed that only three types of 3C, 4H, and 6H crystal systems are included as SiC in the composite sintered body, the proportion of each crystal system can be determined as follows. First, in an X-ray diffraction pattern obtained by irradiation of CuKα rays, a peak which is observed around 2θ=33.7 degrees is set to be I1, a peak which is observed around 2θ=34.1 degrees is set to be I2, and a peak which is observed around 2θ=35.8 degrees is set to be I3. Further, the proportion of the 3C crystal system which is included in SiC is set to be X, the proportion of the 4H crystal system is set to be Y, and the proportion of the 6H crystal system is set to be Z. In this case, the proportion of each crystal system can be obtained by solving the following simultaneous equations.

$I1=9.9y$ $I2=19.4z$ $I3=100.0x+25.1y+59.2z$ $X=x/(x+y+z), Y=y/(x+y+z), Z=z/(x+y+z)$

In order to make the proportion of the 4H-type α-SiC which is included in the entire SiC 30% by volume or less, in the X-ray diffraction pattern obtained by irradiation of CuKα rays, it is preferable that the ratio (I1/I3) of the peak (I1) which is observed around 2θ=33.7 degrees and an integral value of the peak (I3) which is observed around 2θ=35.8 degrees is set to be 0.04 or less. Further, in order to make the proportion of the 4H-type α-SiC which is included in the entire SiC 20% by volume or less, it is preferable that I1/I3 is set to be 0.02 or less, and in order to make the proportion of the 4H-type α-SiC which is included in the entire SiC 10% by volume or less, it is further preferable that I1/I3 is set to be 0.01 or less.

The I3 peak in the X-ray diffraction pattern is a peak which commonly appears in α-SiC and β-SiC in the case of SiC. For this reason, it can be said that the I3 peak is a peak corresponding to the total amount of SiC.

On the other hand, the I1 peak in the X-ray diffraction pattern is a peak which is observed in 4H-type SiC. For this reason, it can be said that the I1 peak is a peak corresponding to the amount of particularly 4H-type SiC among α-SiC.

For this reason, by obtaining the value of I1/I3, it is possible to determine the proportion of 4H-type α-SiC which is included in the entire SiC.

The composite sintered body includes pores which are present at crystal grain boundaries, and is preferably densified such that the ratio of the apparent density of the composite sintered body to the hypothetical true density when the composite sintered body is assumed not to include the pores is 97% or more and more preferably 98% or more. In the composite sintered body, the sintering of raw material powder progresses, whereby the amount of the pores decreases and the apparent density comes close to 100%. If the above ratio is 97% or more, corrosion resistance against plasma (plasma resistance) becomes good, which is preferable.

Further, in the composite sintered body, it is favorable if a crystallite diameter obtained from the X-ray diffraction result of the crystal grain of SiC is 50 nm or more. Further, the crystallite diameter of SiC is preferably 200 nm or less and more preferably 100 nm or less. The crystallite diameter obtained from the X-ray diffraction result is obtained as the average size of crystal grains which are included in the composite sintered body. If the crystallite diameter of SiC is such a value, pores or defects between SiC particles gathered at the grain boundary can be reduced, and therefore, the density can be increased. Further, if the crystallite diameter of SiC is such a value, it is possible to improve the durability against plasma of the composite sintered body, and the characteristics against desorption of particles, generation of particles, and the like.

Further, in the composite sintered body configuring the base of this embodiment, it is preferable that it includes a portion at which the β-SiC grains are sintered with each other. The composite sintered body having such a portion shows that the β-SiC grains are sintered with each other without causing the phase transition from β-SiC to α-SiC at the time of sintering.

The β-SiC grains are sintered with each other, whereby it is possible to reduce pores or defects which are present between SiC particles adjacent to each other in SiC in which a plurality of particles remain to be aggregated without being dispersed in a single particle, or SiC segregated in a sintering process. For this reason, it is possible to increase the density of the composite sintered body. Further, the β-SiC grains are sintered with each other, whereby it is possible to increase the durability against plasma of the composite sintered body. Further, the β-SiC grains are sintered with each other, whereby it is possible to suppress desorption of particles or generation of particles.

Further, SiC sintered at the grain boundaries of the insulating particles in the sintering process has a shape matching the grain boundaries of the insulating particles in the sintering process, and therefore, the density can be increased. Further, it is possible to reduce defects at the boundaries between the insulating particles and the SiC particles.

Further, in a case of including the portion at which the β-SiC grains are sintered with each other, the electrical resistance between the SiC particles is lowered compared to a case where SiC particles are in contact with each other without being sintered with each other. For this reason, it is possible to improve the electrical characteristics of the composite sintered body.

[Ceramic Material (Composite Sintered Body) Part 2]

Next, a ceramic material (a composite sintered body for an electrostatic chuck) of a second embodiment of the present invention will be described in detail.

As described above, the base of the electrostatic chuck device of this embodiment uses a ceramic material satisfying the following (i) and (ii) as a forming material thereof.

(i) When a test piece of the ceramic material having a thickness of 0.3 mm is sandwiched between electrodes having the same diameter of 20 mm and measured at a voltage increase rate of 1000 V/sec. according to the short time test prescribed in JIS C2110-2, a voltage value when a current value flowing through the test piece exceeds 1 μA is 10 kV/mm or more.

(ii) When a current value flowing through the test piece is measured every 0.1 sec. in the test which is performed under the same condition as the above (i), with respect to a time when the current value increases over 10 μA per 0.1 sec., a current value corresponding to a voltage value 0.1 sec. before the above time is 5 μA or more.

The ceramic material of this embodiment satisfies the requirement of the above (i), whereby in a case where the ceramic material of this embodiment is used as a constituent member of a Coulomb's force type electrostatic chuck device, the ceramic material can be used without dielectric breakdown when a voltage is applied thereto.

Further, the ceramic material of this embodiment satisfies the requirement of the above (ii), whereby in an electrostatic chuck device using the ceramic material of this embodiment as a forming material thereof, it is possible to discharge electric charges electrically charged in the ceramic material, without electric discharge of the ceramic material. For this reason, it is possible to prolong a period until insulation failure occurs. Further, it is possible to prevent damage to parts other than the ceramic material of an electrostatic chuck, the plate-shaped samples such as a wafer to be treated, a semiconductor manufacturing apparatus using the electrostatic chuck, or the like, due to the electric discharge of the ceramic material.

In the ceramic material of this embodiment, it is more preferable that the withstand voltage of the test piece according to the above (i) is 20 kV/mm or more. If the withstand voltage is 20 kV/mm or more, the ceramic material has sufficient durability at a voltage at which the ceramic material attracts the sample as an electrostatic chuck.

In the ceramic material of this embodiment, the withstand voltage of the test piece according to the above (i) is preferably 80 kV/mm or less and more preferably 60 kV/mm or less. If the withstand voltage is 80 kV/mm or less, when electric charges are accumulated in the ceramic material which is used for the electrostatic chuck device by being exposed to plasma, it is difficult for the potential of the ceramic material to become high, and thus it is difficult for electric discharge to occur.

In the ceramic material of this embodiment, the critical current value of the test piece according to the above (ii) is more preferably 10 μA or more and further preferably 30 μA or more. The critical current value is increased, whereby it is possible to further increase the durability in a case of using the ceramic material as an electrostatic chuck.

In the ceramic material of this embodiment, when a withstand voltage test of the test piece according to the above (i) is performed, it is preferable that the ceramic material has a characteristic that a current continuously increases until a current value exceeds 50 μA, and it is more preferable that the ceramic material has a characteristic that a current continuously increases until a current value exceeds 100 μA.

By widening the range of the current value in which a current continuously increases, it is possible to further enhance the reliability of the ceramic material.

As such a ceramic material which is used for the mounting plate, if the characteristics of the above (i) and (ii) are satisfied, a ceramic sintered compact may be processed into a flat plate shape and used, or a ceramic material formed by forming the electrostatic attraction electrode on the supporting plate and then performing thermal spray coating may be used. Among them, in addition to reducing defects such as pores, it is possible to enhance the quality stability such as electrical characteristics or strength, and therefore, a method using a sintered compact is preferable.

The ceramic material may use only the insulating ceramic, and the electrical characteristics thereof may be adjusted so as to provide a material satisfying the characteristics of the above (i) and (ii), by adding an electrical conductivity-imparting material such as $TiO_2$, which reacts with $Al_2O_3$ to produce a compound. It is preferable that the ceramic material is a composite of insulating ceramic and electrical conductive particles.

As the insulating ceramic, an insulating ceramic material which is an oxide made of only one kind selected from the group consisting of $Al_2O_3$, yttrium oxide ($Y_2O_3$), aluminum nitride (AlN), silicon nitride ($Si_3N_4$), mullite ($3Al_2O_3 \cdot 2SiO_2$), magnesium oxide (MgO), magnesium fluoride ($MgF_2$), hafnium oxide ($HfO_2$), scandium oxide ($Sc_2O_3$), neodymium oxide ($Nd_2O_3$), niobium oxide ($Nb_2O_5$), samarium oxide ($Sm_2O_3$), ytterbium oxide ($Yb_2O_3$), erbium oxide ($Er_2O_3$), and cerium oxide ($CeO_2$), or a mixture obtained by mixing two or more kinds can be exemplified.

Further, as the insulating ceramic, a double oxide which is an oxide containing two or more kinds of metal ions may be used. As such a double oxide, yttrium aluminum garnet (YAG: $3Y_2O_3 \cdot 5Al_2O_3$) can be exemplified.

Among these, in particular, $Al_2O_3$ is inexpensive, has excellent heat resistance or corrosion resistance, and also provides excellent mechanical properties of a composite sintered body, and therefore, it is also suitably used for the composite sintered body of this embodiment.

Further, in a case where it is desired to use an insulating ceramic with a low aluminum content, yttrium oxide ($Y_2O_3$) can also be used. Further, in a case where it is desired to further increase corrosion resistance than in $Al_2O_3$, $Y_2O_3$, yttrium aluminum garnet (YAG: $3Y_2O_3 \cdot 5Al_2O_3$), or the like can also be used.

As the conductive particles, one kind or two or more kinds selected from the group consisting of conductive ceramic particles such as conductive silicon carbide (SiC) particles, high melting point metal particles such as molybdenum (Mo) particles, tungsten (W) particles, or tantalum (Ta) particles, and carbon (C) particles are preferable.

Among them, as the conductive particles, SiC particles are preferable. In a case of compounding SiC particles with aluminum oxide ($Al_2O_3$) particles, a composite sintered body of the SiC particles and the $Al_2O_3$ particles is preferable because the temperature dependence of electrical characteristics is small. Further, the composite sintered body of the SiC particles and the $Al_2O_3$ particles is preferable because corrosion resistance to halogen gas is excellent, heat resistance and thermal shock resistance are high, and a risk of damage due to thermal stress even in the use at a high temperature is low.

In SiC, a large number of crystal structures are known, and silicon carbide having a 3C type (zincblende type) crystal structure in a cubic system, silicon carbide having a wurtzite type crystal structure in a hexagonal system of a 4H type, a 6H type, or the like, and silicon carbide having a 15R type crystal structure in a rhombohedral system can be given as an example. Among these, the silicon carbide having a 3C type crystal structure is referred to as "$\beta$-SiC". Further, all of silicon carbides having crystal structures other than it are referred to as "$\alpha$-SiC".

As the SiC particles, from the viewpoint of excellent electrical conductivity, it is preferable that SiC particles having a $\beta$-type crystal structure are used for a raw material. In order to control the electrical conductivity of the SiC particles, SiC particles in which the content rate of nitrogen in SiC is appropriately controlled may be used.

As the SiC particles, SiC particles obtained by various methods such as a plasma CVD method, a precursor method, a thermal carbon reduction method, and a laser pyrolysis method can be used. In particular, in a case where the dielectric material of this embodiment is used in a semiconductor process, it is preferable to use high-purity SiC particles in order to prevent adverse influences in the semiconductor process.

In this embodiment, an example is described in which a composite sintered body manufactured by using $Al_2O_3$ as the insulating ceramic and using SiC as the conductive particles is used.

SiC which is included in the composite sintered body has crystal grains having a $\alpha$-SiC type crystal structure (hereinafter referred to as $\alpha$-SiC grains) and crystal grains having a $\beta$-SiC type crystal structure (hereinafter referred to as $\beta$-SiC grains).

In the composite sintered body configuring the base of this embodiment, the crystal grains of SiC are dispersed in the crystal grain boundary and the interior of the crystal grain of a main phase formed by sintering crystal grains of $Al_2O_3$ which is the insulating ceramic.

The content rate of SiC in this composite sintered body is preferably 4% by volume or more and 23% by volume or less, more preferably 5% by volume or more and 20% by volume or less, and further preferably 6% by volume or more and 12% by volume or less.

Here, the reason why the content rate of SiC is set to be in the above range is because when the content rate of SiC is less than 4% by volume, the amount of SiC becomes too small with respect to the insulating ceramic, so that it becomes difficult to obtain the effect of improving the adsorption/desorption characteristics or the thermal conductivity in a case of use as an electrostatic chuck by addition of SiC. On the other hand, the reason is because if the content rate of the conductive particles exceeds 23% by mass, the amount of the conductive particles becomes too large with respect to the insulating material, so that it becomes difficult to obtain the withstand voltage characteristic necessary for use as an electrostatic chuck.

The average particle diameter of the insulating ceramic in the composite sintered body is preferably 2 μm or less. If the average particle diameter of the $Al_2O_3$ particles exceeds 2 μm, in a case where a base material of the electrostatic chuck device is manufactured using this composite sintered body, the upper surface of the base material on the side on which the plate-shaped sample is mounted is easily etched by plasma. For this reason, sputter marks are formed on the upper surface of the base material, and there is a concern that they may cause contamination of an object to be attracted, such as a silicon wafer.

In the SiC particles in the composite sintered body, fine SiC particles having a particle diameter of 0.04 μm or less are included preferably in an amount of 0.001% by volume or more and more preferably in an amount of 1% by volume or more with respect to the entire composite sintered body. The SiC particles having a particle diameter of 0.04 μm or less are included in an amount of 0.001% by volume or more, so that the average interval in which the SiC particles having a particle diameter of 0.04 µm or less are present becomes 1.5 µm or less. For this reason, in a case where the average particle diameter of the insulating ceramic particles is 2 µm or less, one or more SiC particles having a particle diameter of 0.04 µm or less are present with respect to one insulating ceramic particle. In this manner, fine SiC particles are included in the composite sintered body, whereby in a case where the composite sintered body is used as a constituent member of the electrostatic chuck device, the effect of improving electrical characteristics such as attraction characteristics and dielectric properties is obtained.

Further, in the SiC particles in the composite sintered body, it is preferable that the particle diameter D10 in which a cumulative volume percentage in the volume particle size distribution of SiC particles is 10% by volume is 0.2 µm or less. In the composite sintered body, in a case where raw material particles become sintered polycrystalline bodies and are dispersed in the composite sintered body, a particle diameter is calculated using crystal grains of a sintered mass as the same particles.

Further, it is preferable that the particle diameter D90 in which a cumulative volume percentage in the volume particle size distribution of SiC particles is 90% by volume is 2 µm or less.

Further, it is preferable that the ratio (D90/D10) of D10 to D90 is 3.0 or more.

Further, it is preferable that the ratio (D90/D50) of D50 to D90 is 1.4 or more.

The particle diameter of the SiC particle is set to be within these ranges, whereby the dielectric breakdown of the electrostatic chuck device using the composite sintered body as the material for forming a constituent member can be gently progressed.

When metal elements other than aluminum and silicon are assumed to be "metal impurities", the content rate of metal impurities in the composite sintered body is set to be preferably 1000 ppm or less and more preferably 100 ppm or less. Further, the metal impurity rate of each of SiC and the insulating ceramic which are included in the composite sintered body is set to be preferably 1000 ppm or less and more preferably 100 ppm or less. If the metal impurities are 1000 ppm or less, a possibility of contaminating a semiconductor wafer is lowered, and the temperature dependence of the electric resistance of the electrostatic chuck device is reduced, which is preferable.

SiC which is included in the composite sintered body has crystal grains having a α-SiC type crystal structure (hereinafter referred to as α-SiC grains) and crystal grains having a β-SiC type crystal structure (hereinafter referred to as β-SiC grains). In the composite sintered body configuring the base of this embodiment, β-SiC grains are included more than 60% by volume with respect to the entirety of the crystal grains of SiC. That is, the content rate of α-SiC grains is less than 40% by volume with respect to the entirety of the crystal grains of SiC.

It is preferable if the content rate of β-SiC grains with respect to the entirety of the crystal grains of SiC is 80% by volume or more, 90% by volume or more is more preferable, and 95% by volume or more is further preferable. That is, it is preferable if the content rate of α-SiC grains is 20% by volume or less with respect to the entirety of the crystal grains of SiC, 10% by volume or less is more preferable, and 5% by volume or less is further preferable.

Comparing α-SiC and β-SiC, α-SiC is thermodynamically stable.

A temperature at which SiC undergoes a phase transition or a crystal form to be transitioned varies according to various factors such as impurities which are included in SiC or gas which is present in the surroundings. However, the phase transition from β-SiC to α-SiC occurs at a temperature of about 1750° C. or higher. $Al_2O_3$—SiC known in the related art is sintered at a high temperature in order to densify a sintered compact, and as a result, β-SiC undergoes the phase transition to α-SiC during sintering, and thus a large amount of α-SiC which causes a decrease in durability is included.

In contrast, in the composite sintered body configuring the base of this embodiment, it is manufactured by a manufacturing method which will be described later, whereby the phase transition from β-SiC to α-SiC is suppressed, and the ratio of β-SiC is controlled to be more than 60% by volume. In this way, it is possible to suitably obtain the characteristics of the above (i) and (ii) defined for the ceramic material of this embodiment, and thus it is possible to obtain a composite sintered body for an electrostatic chuck, in which durability in a case of using it as an electrostatic chuck in a plasma processing apparatus is high.

The temperature at which SiC undergoes a phase transition or the crystal form to be transitioned varies according to various factors such as impurities which are included in SiC or gas which is present in the surroundings. However, the phase transition from β-SiC to α-SiC occurs at a temperature of about 1750° C. or higher. $Al_2O_3$—SiC known in the related art is sintered at a high temperature in order to densify a sintered compact, and as a result, β-SiC undergoes the phase transition to α-SiC during sintering, and thus a large amount of α-SiC is included.

In contrast, in the composite sintered body configuring the base of this embodiment, it is manufactured by a manufacturing method which will be described later, whereby the phase transition from β-SiC to α-SiC is suppressed, and the ratio of β-SiC is controlled to be more than 60% by volume. In this way, it is possible to improve the electrical characteristics of the composite sintered body, and the critical current value increases, so that it is possible to prevent insulation failure of the ceramic material when using it as an electrostatic chuck.

As a cause of such a phenomenon, the following is conceivable.

The reason why the characteristic with high critical current value can be obtained by making the ratio of β-SiC more than 60% by volume is believed to be due to the electrical conductivity of α-SiC being lower than the electrical conductivity of β-SiC. In α-SiC, the amount of heat generation when the same current flows is large as compared with β-SiC. For this reason, in a composite sintered body of the related arts, when a current flows due to application of voltage, the amount of heat generation in α-SiC is large, a sample melts in a minute region around α-SiC, and a current value suddenly increases, causing insulation failure.

That is, in a case where a large amount of α-SiC is included in the composite sintered body, since α-SiC has lower electrical conductivity than β-SiC, local heat generation when a minute current flows in the sintered compact becomes large.

Further, in a case where α-SiC is included in SiC, the proportion of 4H-type α-SiC which is included in the entire SiC is preferably 30% by volume or less, more preferably 20% by volume or less, and further preferably 10% by volume or less. This is because the 4H-type SiC becomes a P-type semiconductor due to the presence of Al, or the like, so that the electrical conductivity of SiC is further reduced.

Further, in a case where α-SiC is included in SiC, it is preferable that the proportion of 6H-type α-SiC which is included in the entire SiC is set to be 20% by volume or less, it is more preferable that it is set to be 10% by volume or less, and it is further preferable that it is set to be 5% by volume or less.

The 6H-type SiC has lower electrical conductivity than β-SiC. Further, since the crystal grain of the 6H-type SiC has a larger aspect ratio than the crystal grain of the 4H-type SiC, it is easy to form a conductive path. For this reason, in a case where the 6H-type SiC is present, compared to a case where only the 4H-type SiC is present, the electrical characteristics or plasma resistance of the composite sintered body decreases by an amount corresponding to the formation of the conductive path by the 6H-type SiC having low electrical conductivity.

In this embodiment, the analysis of the crystal form of SiC (α-SiC, β-SiC) in the composite sintered body is performed by using the result obtained by measuring powder X-ray diffraction intensity and calculating it with the Ruska method (J. Mater. Sci., 14, 2013-2017 (1979)).

The existence of a large number of crystal structures of SiC is known as polymorphism. Polymorphisms appearing in a SiC material are usually 2H, 3C, 4H, 6H, and 15R. On the other hand, in crystal forms which are obtained by calculation, crystal forms having a low possibility of appearance due to a crystal form of a raw material which is used, a sintering temperature, or the like can be excluded. In a case where 3C or 6H crystal form is used for the crystal form of SiC powder which is used for a raw material and a sintering temperature is set to be in a range of 1500° C. to 2000° C., calculation may be performed with only three kinds of 3C, 4H, and 6H crystal systems being included. In a case where the peak of the polymorphism of SiC is at a position close to a peak caused by an insulating material, it is preferable that the peak is not used for the calculation and other peaks are used for the calculation.

In a case where it is assumed that only three kinds of 3C, 4H, and 6H crystal systems are included as SiC in the composite sintered body, the proportion of each crystal system can be determined as follows. First, in the X-ray diffraction pattern obtained by irradiation of CuKα rays, a peak which is observed around 2θ=33.7 degrees is set to be I1, a peak which is observed around 2θ=34.1 degrees is set to be I2, and a peak which is observed around 2θ=35.8 degrees is set to be I3. Further, the proportion of the 3C crystal system which is included in SiC is set to be X, the proportion of the 4H crystal system is set to be Y, and the proportion of the 6H crystal system is set to be Z. In this case, the proportion of each crystal system can be obtained by solving the following simultaneous equations.

$I1 = 9.9y$ $I2 = 19.4z$ $I3 = 100.0x + 25.1y + 59.2z$ $X = x/(x+y+z),\ Y = y/(x+y+z),\ Z = z/(x+y+z)$

In order to make the proportion of the 4H-type α-SiC which is included in the entire SiC 30% by volume or less, in the X-ray diffraction pattern obtained by irradiation of CuKα rays, it is preferable that the ratio (I1/I3) of the peak (I1) which is observed around 2θ=33.7 degrees and an integral value of the peak (I3) which is observed around 2θ=35.8 degrees is set to be 0.04 or less. Further, in order to make the proportion of the 4H-type α-SiC which is included in the entire SiC 20% by volume or less, it is preferable that I1/I3 is set to be 0.02 or less, and in order to make the proportion of the 4H-type α-SiC which is included in the entire SiC 10% by volume or less, it is further preferable that I1/I3 is set to be 0.01 or less.

The I3 peak in the X-ray diffraction pattern is a peak which commonly appears in α-SiC and β-SiC in the case of SiC.

On the other hand, the I1 peak in the X-ray diffraction pattern is a peak which is observed in 4H-type SiC. For this reason, it can be said that the I1 peak is a peak corresponding to the amount of particularly the 4H-type SiC among α-SiC.

For this reason, by obtaining the value of I1/I3, it is possible to determine the proportion of 4H-type α-SiC which is included in the entire SiC.

The composite sintered body includes pores which are present at crystal grain boundaries, and is preferably densified such that the ratio of the apparent density of the composite sintered body to the hypothetical true density when the composite sintered body is assumed not to include the pores is 97% or more and more preferably 98% or more. In the composite sintered body, the sintering of raw material powder progresses, whereby the amount of the pores decreases and the apparent density comes close to 100%. If the above ratio is 97% or more, corrosion resistance against plasma (plasma resistance) becomes good, which is preferable.

Further, in the composite sintered body, it is favorable if the crystallite diameter obtained from the X-ray diffraction result of the crystal grain of SiC is 50 nm or more. Further, the crystallite diameter of SiC is preferably 200 nm or less and more preferably 100 nm or less. The crystallite diameter obtained from the X-ray diffraction result is obtained as the average size of crystal grains which are included in the composite sintered body. If the crystallite diameter of SiC is such a value, pores or defects between SiC particles gathered at the grain boundary can be reduced, and therefore, the density can be increased. Further, if the crystallite diameter of SiC is such a value, it is possible to improve the durability against plasma of the composite sintered body, and the characteristics against desorption of particles, generation of particles, and the like.

Further, in the composite sintered body configuring the base of this embodiment, it is preferable that it includes a portion at which the β-SiC grains are sintered with each other. The composite sintered body having such a portion shows that the β-SiC grains are sintered with each other without causing the phase transition from β-SiC to α-SiC at the time of sintering.

The β-SiC grains are sintered with each other, whereby it is possible to reduce pores or defects which are present between SiC particles adjacent to each other in SiC in which a plurality of particles remain to be aggregated without being dispersed in a single particle, or SiC segregated in a sintering process. For this reason, it is possible to increase the density of the composite sintered body. Further, the β-SiC grains are sintered with each other, whereby it is possible to increase the durability against plasma of the composite sintered body. Further, the β-SiC grains are sintered with each other, whereby it is possible to suppress desorption of particles or generation of particles.

Further, SiC sintered at the grain boundaries of the insulating particles in the sintering process has a shape matching the grain boundaries of the insulating particles in the sintering process, and therefore, the density can be increased. Further, it is possible to reduce defects at the boundaries between the insulating particles and the SiC particles.

Further, in a case of including a portion at which the β-SiC grains are sintered with each other, the electrical resistance between the SiC particles is lowered compared to a case where SiC particles are in contact with each other without being sintered with each other. For this reason, it is possible to improve the electrical characteristics of the composite sintered body.

The ceramic materials and the electrostatic chuck devices of the first embodiment and the second embodiment of the present invention have the configurations as described above.

[Method of Manufacturing Ceramic Material]

Next, an embodiment of a method of manufacturing the ceramic material according to each of the first and second embodiments of the present invention will be described. Here, the ceramic material will be described as being a composite sintered body of aluminum oxide and SiC.

The method of manufacturing a composite sintered body of this embodiment is a method in which raw material powder of an insulating material, raw material powder of conductive particles, and a dispersion medium are mixed to form composite powder and the composite powder is sintered under a pressure of 1 MPa or more and 100 MPa or less to obtain a composite sintered body. The sintering conditions include a first sintering step of proceeding with sintering of insulating particles at a temperature lower than the phase transition temperature of SiC particles, and a second sintering step of sintering the mixed particles at a temperature which is higher than in the first sintering step and at which sintering of the SiC particles is performed.

As the insulating ceramic particles, insulating ceramic particles having a sintering temperature lower than a phase transition temperature at which a transition from the β-SiC type crystal structure to the α-SiC type crystal structure is performed are used. In this embodiment, description will be made with an example in which $Al_2O_3$ particles are used as insulating ceramic.

As the SiC particles, β-SiC particles are used. As the β-SiC particles, it is preferable to use β-SiC particles having the amount of metal impurities of 100 ppm or less, and it is more preferable to use β-SiC particles having the amount of metal impurities of 10 ppm or less. Among them, it is preferable that the content of each of Al, Fe, and B is 1 ppm or less. Such high-purity SiC particles can be produced by a CVD method or a laser pyrolysis method.

By using the β-SiC particles having the amount of metal impurities of 100 ppm or less, it is possible to suppress the phase transition from β-SiC to α-SiC. Further, when an electrostatic chuck device using the composite sintered body is used in a plasma process, it is possible to suppress metal contamination of a plate-shaped sample (wafer).

Further, it is preferable that the SiC particles include a large amount of nitrogen atoms in a range where silicon nitride is not produced. If the metal impurities which are included in the SiC particles are small and the content of nitrogen of the SiC particles increases, the nitrogen atom acts as a donor of an electron, so that the electrical conductivity of the SiC particles can be enhanced. Further, it is possible to suppress the phase transition from β-SiC to α-SiC.

It is preferable to use SiC particles in which particles having a particle diameter of 50 nm or less are included preferably in an amount of 10% by volume or more and more preferably in an amount of 40% by volume or more.

By using SiC particles with a fine particle diameter, the number of particles in a case where the same volume is added increases, so that the effect of suppressing grain growth of insulating particles can be enhanced by the pinning effect. Further, by using SiC particles having a fine particle diameter, fine SiC particles are included in the composite sintered body, so that the SiC particles easily come into contact with each other in the composite sintered body. For this reason, in a case where the composite sintered body is used as a constituent member of an electrostatic chuck device, electric characteristics such as attraction characteristics and dielectric properties can be improved.

As the raw material powder of $Al_2O_3$, it is preferable to use $Al_2O_3$ powder having an average particle diameter of 1 μm or less. The reason is because in a SiC—$Al_2O_3$ composite sintered body obtained by using $Al_2O_3$ powder having an average particle diameter exceeding 1 μm, the average particle diameter of the $Al_2O_3$ particles in the composite sintered body exceeds 2 μm, and then, if a base material of an electrostatic chuck device is manufactured by using the SiC—$Al_2O_3$ composite sintered body, the upper surface of the base material on the side on which a plate-shaped sample is mounted is easily etched by plasma, and therefore, sputter marks are formed on the upper surface of the base material and there is a concern that they may cause contamination of an object to be attracted, such as a silicon wafer.

Further, as the raw material powder of $Al_2O_3$, it is preferable to use high-purity raw material powder and it is more preferable to use raw material powder having a purity of 99.99% or more. By using high-purity $Al_2O_3$, it is possible to reduce the influence to promote the phase transition to α-SiC due to solid-solution of impurities in SiC, and it is possible to reduce the phase transition to α-SiC. Further, it is possible to reduce the metal impurities which are included in the composite sintered body to 1000 ppm or less, and thus it is possible to reduce contamination of a semiconductor wafer. Furthermore, by using high-purity $Al_2O_3$, there is also the effect of reducing the temperature dependence of the electrical resistance of the electrostatic chuck device.

A method of mixing the insulating particles and the SiC particles is not particularly limited. However, a method is preferable in which dispersion treatment is performed in a dispersion medium by using a disperser such as an ultrasonic homogenizer, a bead mill, or an ultra-high pressure pulverizer.

If the raw material powder of the insulating particles and the raw material powder of the conductive particles are not uniformly mixed with each other, the distribution of the SiC particles in the insulating ceramic obtained by compounding becomes non-uniform, and thus there is a concern that the reproducibility of electric characteristics and uniformity in the sintered compact may deteriorate. For this reason, it is preferable to properly select a dispersion medium, a dispersant, or a dispersion treatment condition and uniformly mix the raw material powder of the insulating particles and the raw material powder of the conductive particles. It is favorable if the distribution of the SiC particles is made such that the distribution of secondary particle diameters in which single particles are aggregated is uniform.

The insulating particles and the SiC particles dispersed in the dispersion medium are made into composite particles by using a drying apparatus such as a spray dryer.

It is preferable to use a pressure-sintering apparatus (hot press) as a method of sintering the composite powder under a pressure of 1 MPa or more and 100 MPa or less in an inert gas atmosphere to obtain a composite sintered body.

The sintering conditions include the first sintering step of proceeding with only the sintering of the insulating particles at a temperature lower than the phase transition temperature of the SiC particles, and the second sintering step of sintering the mixed particles at a temperature which is higher than in the first sintering step and at which sintering of the SiC particles is performed.

This is because after the sintering of the insulating particles progresses in the first sintering step, the SiC particles are sintered with each other in the second sintering step, so that it is possible to suppress the transition from β-SiC to α-SiC.

Further, in the first sintering step, it is preferable to perform sintering under the condition that the relative density of the sintered compact is densified to 95% or more at the stage at which the first sintering step is ended. The relative density at the stage at which the first sintering step is ended can be calculated from the value of a displacement meter of a press machine of a pressure-sintering apparatus, in addition to being confirmed by preparing a sintered compact taken out after only the first sintering step is performed.

As the sintering temperature in the first sintering step, a temperature of 1300° C. or higher and 1700° C. or lower is preferable, and a temperature of 1400° C. or higher and 1700° C. or lower is more preferable. Further, in order to sufficiently perform the sintering, it is preferable to hold the sintering temperature for 1 hour or more. The temperature of the phase transition of β-SiC to α-SiC is about 1800° C., whereas, for example, the mixed particles are heated at 1650° C. for 4 hours to be sintered.

At that time, the pressing pressure of the sintered compact is preferably 20 MPa or more and more preferably 30 MPa or more. In this way, the insulating ceramic particles ($Al_2O_3$ particles) are sintered and densified without the phase transition of the SiC particles. Further, SiC particles are gathered in a crystal grain boundary and the interior of a crystal grain of a main phase formed by sintering of $Al_2O_3$ crystal grains.

It is preferable that the pressing pressure of the sintered compact is not pressurized between room temperature and 1000° C. and is increased to the maximum pressure by increasing the pressure at a pressure rising rate of 1 MPa/min or less until the first sintering step is ended. By changing the relationship between the temperature and the pressing pressure or the sintering condition such as the pressure rising rate in a temperature range where sintering progresses, it is possible to control the particle size distribution of SiC when formed into a composite sintered body.

Subsequently, in the second sintering step, the mixed particles are sintered at a temperature which is higher than the sintering temperature in the first sintering step and at which the sintering of SiC progresses. In a case where $Al_2O_3$ is used for the insulating ceramic particles, it is preferable that the sintering temperature is 1750° C. or higher and 1900° C. or lower. For example, the mixed particles are heated at 1780° C. for 4 hours to be sintered. At that time, the pressing pressure of the sintered compact is preferably 20 MPa or more and more preferably 30 MPa or more. In this way, the sintering of the $Al_2O_3$ particles progresses further. At the same time, the sintering of SiC existing in the state of SiC particles gathered at the crystal grain boundaries or secondary particles in which single particles are aggregated in the composite powder also progresses. In this way, a composite sintered body in which the whole is densified is obtained.

It is known that β-SiC grains are easily phase-transitioned to α-SiC in the course of grain rearrangement or grain growth according to sintering. In the manufacturing method of this embodiment, in advance in the first sintering step, partial sintering is performed to densify the whole and SiC particles are locally gathered in a narrow region such as a crystal grain boundary or the interior of a crystal grain of a main phase formed by sintering of $Al_2O_3$ crystal grains. Then, even when the SiC particles are sintered with each other in the second sintering step, only a small amount of SiC particles exist around the SiC particles, and therefore, even if the SiC particles are sintered with each other, it is thought that a phase transition according to the grain growth of SiC particles can be suppressed. Further, the sintering progresses, whereby the pressing pressure is sufficiently transmitted to the SiC particles, so that the effect of making the pressure suppress a phase transition acts, and thus it is thought that the transition to α-SiC is suppressed. Further, $Al_2O_3$ is densified, whereby solid-solution of aluminum in $Al_2O_3$ to SiC becomes difficult, and thus it is thought that the transition to α-SiC which is a 4H phase is suppressed.

At the time of temperature lowering after holding for a predetermined time at the maximum temperature (sintering temperature) in the second sintering step, the pressing pressure of the composite sintered body is maintained at preferably 20 MPa or more and more preferably 30 MPa or more until the temperature of the sintered compact reaches 1600° C. or lower. If the pressing pressure is continuously applied until a temperature reaches a temperature equal to or lower than the temperature at which a phase transition occurs, the transition to α-SiC can be prevented due to the effect of making the pressure suppress the phase transition.

Further, it is preferable that the pressing pressure of the composite sintered body is released in a temperature range in which the temperature of the composite sintered body is 1300° C. or higher and 1700° C. or lower and preferably 1400° C. or higher and 1600° C. or lower. If cooling is performed while applying the pressing pressure until the temperature of the sintered compact reaches a temperature lower than 1300° C., a large amount of residual stress remains in the obtained composite sintered body, and thus there is a concern that the composite sintered body may be easily broken.

According to the composite sintered body for an electrostatic chuck having the configuration as described above, it is possible to obtain a composite sintered body (ceramic material) for an electrostatic chuck having excellent durability.

Further, according to the electrostatic chuck device as described above, since the composite sintered body (ceramic material) for an electrostatic chuck described above is used, it is possible to obtain an electrostatic chuck device having excellent durability.

The preferred embodiments of the present invention has been described above with reference to the accompanying drawings. However, it goes without saying that the present invention is not limited to such examples. The shapes, combinations, or the like of the respective constituent members shown in the examples described above are merely examples, and various changes can be made based on design requirements or the like within a scope which does not depart from the gist of the present invention.

EXAMPLES

Hereinafter, the present invention will be described with examples. However, the present invention is not limited to these examples.

Example 1

Weighing was performed such that β-type SiC powder having an average particle diameter of 0.04 μm is 10% by volume and $Al_2O_3$ powder having an average particle diameter of 0.1 μm is 90% by volume, and the SiC powder and the $Al_2O_3$ powder were subjected to dispersion treatment in an aqueous solvent for 5 hours in a ball mill. The obtained dispersion liquid was dried at 200° C. by using a spray drier to obtain composite powder of $Al_2O_3$ and SiC.

Subsequently, the obtained mixed powder was subjected to forming and then heated to 1300° C. at 10° C./minute without applying pressure, under an argon atmosphere. Thereafter, a pressing pressure was increased at 0.2 MPa/minute while maintaining the heating rate at 10° C./minute. At the point in time of reaching 1650° C., the pressing pressure was 7 MPa. Further, when the temperature was maintained at 1650° C. and the pressure rising was continued, the pressing pressure reached 40 MPa at the point in time when a holding time has passed 165 minutes. Thereafter, a first sintering step was completed at the point in time when the holding time at 1650° C. reached 4 hours, while the pressing pressure was maintained at 40 MPa.

Thereafter, while the pressing pressure to the forming body obtained in the first sintering step was maintained at 40 MPa, a temperature was increased from 1650° C., which is the holding temperature in the first sintering step, to 1880° C. at 5° C./minute. A second sintering step was performed by maintaining a sintering temperature of the formed body obtained in the first sintering step at 1880° C. and the pressing pressure at 40 MPa for 4 hours.

Subsequently, heating in a sintering furnace was ended while maintaining the pressing pressure to the formed body obtained in the second sintering step at 40 MPa at a temperature of 1880° C., and the sintering furnace was cooled to 1500° C.

After the pressing pressure was released at 1500° C., the formed body obtained in the second sintering step was cooled to room temperature to obtain a ceramic material (a composite sintered body) of Example 1.

Example 2

A ceramic material (a composite sintered body) of Example 2 was obtained in the same manner as in Example 1 except that the pressing pressure in the first sintering step was 25 MPa, a time in which the pressing pressure reached 25 MPa after the holding start at 1650° C., the holding temperature in the second sintering step was 1780° C., and the pressing condition in the second sintering step was set to be 25 Mpa.

Example 3

A ceramic material (a composite sintered body) of Example 3 was obtained in the same manner as in Example 1 except that the holding temperature in the second sintering step was set to be 1780° C.

Comparative Example 1

The mixed powder obtained by the method of Example 1 was subjected to forming and then heated to 1300° C. at 10° C./minute without applying pressure, under an argon atmosphere.

Thereafter, the pressing pressure was increased at 0.2 MPa/minute while maintaining the heating rate at 10° C./minute. The pressing pressure at the point in time of reaching 1780° C. was 9.6 MPa, and the pressing pressure at 1880° C. was 11.6 MPa.

When the temperature was maintained at 1880° C. and the pressure rising was continued, the pressing pressure reached 25 MPa at the point in time when the holding time has passed 67 minutes.

Thereafter, the heating was ended at the point in time when the holding time at 1880° C. was 4 hours while maintaining the pressing pressure at 25 MPa, the pressing pressure was released at 1880° C., and cooling was then performed to room temperature to obtain a ceramic material (a composite sintered body) of Comparative Example 1.

Comparative Example 2

A commercially available $Al_2O_3$ sintered compact (AR-996, manufactured by Asuzac Co.) having a purity of 99.6% was used as a ceramic material (a sintered compact) of Comparative Example 2.

The respective ceramic materials (composite sintered bodies) obtained were measured by the following method.

(Analysis of Crystal Phase)

A crystal phase was identified by a powder X-ray diffraction method using an X-ray diffractometer (model name: X'Pert PRO MPD, manufactured by PANalytical).

The crystal phase was identified by using a method of obtaining the proportion of the crystal form of SiC by using a calculated value of the theoretical intensity of a diffraction line and a measured value of X-ray diffraction intensity and calculating a solution by solving simultaneous equations.

It was assumed that the crystal form of SiC included three types of 3C, 4H, and 6H, and as the peaks used for calculation, three peaks; a peak which is observed around 2θ=33.7 degrees, a peak which is observed around 2θ=34.1 degrees, and a peak which is observed around 2θ=35.8 degrees in an X-ray diffraction pattern obtained by irradiation of CuKα rays, were used. As the calculated value of the relationship between the crystal form of SiC and the theoretical intensity of the diffraction line, a calculated value of Ruska (J. Mater. Sci., 14, 2013-2017 (1979)) was used.

When in the X-ray diffraction pattern, the ratio (I1/I3) of the peak (I1) which is observed around 2θ=33.7 degrees and the peak (I3) which is observed around 2θ=35.8 degrees is about 0.01 or less, it overlaps data which is a background, and becomes equal to or less than a detection limit. For this reason, the peak intensity of I1 was calculated as a value of 0.01 times the value of I3. In a case of including only 3C and 4H, the detection limit of 4H-type α-SiC is about 10%.

When in the X-ray diffraction pattern, the ratio (I2/I3) of the peak (I2) which is observed around 2θ=34.1 degrees and the peak (I3) which is observed around 2θ=35.8 degrees is about 0.01 or less, it overlaps data which is a background, and becomes equal to or less than a detection limit. For this reason, the peak intensity of I2 was calculated as a value of 0.01 times the value of I3. In a case of including only 3C and 6H, the detection limit of 4H-type α-SiC is about 5%.

The content rate of β-SiC in the entire SiC was obtained from the measurement results.

The density of the composite sintered body was obtained by the Archimedes method with the theoretical density of SiC being 3.21 and the theoretical density of $Al_2O_3$ being 4.0.

Table 1 shows the manufacturing conditions of the ceramic materials of Examples 1 and 2 and Comparative Examples 1 and 2.

TABLE 1

|  | First sintering step | | Second sintering step | | Press release temperature |
| --- | --- | --- | --- | --- | --- |
|  | Temperature condition | Pressure condition | Temperature condition | Pressure condition | |
| Example 1 | 1650° C. × 4 hr. | 40 MPa | 1880° C. × 4 hr. | 40 MPa | 1500° C. |
| Example 2 | 1650° C. × 4 hr. | 25 MPa | 1780° C. × 4 hr. | 25 MPa | 1500° C. |
| Example 3 | 1650° C. × 4 hr. | 40 MPa | 1780° C. × 4 hr. | 40 MPa | 1500° C. |
| Comparative Example 1 | NO | | 1880° C. × 4 hr. | 25 MPa | 1880° C. |
| Comparative Example 2 | Obscurity | | | | |

(Withstand Voltage Evaluation)

A short time test prescribed in JIS C2110-2 was performed using the obtained plate-shaped test pieces of Examples 1 and 2 and Comparative Examples 1 and 2 according to JIS C2110-2.

Specifically, the obtained plate-shaped test pieces of Examples 1 and 2 and Comparative Examples 1 and 2 were clamped by electrodes each having a diameter of 20 mm and a direct-current voltage was applied thereto in a thickness direction. A current value was measured while increasing the applied voltage at a rate of 1000 V/sec. (3.3 kV/(=sec.)). The current value was measured at intervals of 0.05 sec. In a case where the current value which is measured at intervals of 0.05 sec. instantaneously increased and after 0.05 sec., it became a value equal to or less than twice the measured value 0.1 sec. before, it was regarded as noise and was not used for evaluation.

In the measurement, the applied voltage was cut off in a case where the current has reached 150 µA or more.

FIGS. 2 to 5 are graphs showing the measurement results of Examples 1 and 2 and Comparative Examples 1 and 2, respectively.

In Example 1, the current value continuously increased until it exceeded 150 µA, according to an increase in the voltage.

In Example 2, after the current value continuously increased until the current value reached 77 µA, the current value suddenly increased 0.1 sec. later and became 150 µA or more, and thus a high-voltage power supply applying the voltage was cut off.

In Comparative Example 1, after the current value continuously increased until it reached 4.5 µA, the current value suddenly increased 0.1 sec. later and became 150 µA or more, and thus a high-voltage power supply applying the voltage was cut off.

In Comparative Example 2, after the current value reached 0.8 µA, the current value suddenly increased 0.1 sec. later and became 150 µA or more, and thus a high-voltage power supply applying the voltage was cut off.

The evaluation results for Examples 1 and 2 and Comparative Examples 1 and 2 are shown in Table 2. The critical current value and the withstand voltage value described in Table 2 are those read from the graphs shown in FIGS. 2 to 5.

TABLE 2

|  | Critical current value | Withstand voltage |
| --- | --- | --- |
| Example 1 | 58 µA | 38 kV/mm (11.3 kV/0.3 mm) |
| Example 2 | 47 µA | 33 kV/mm (9.9 kV/0.3 mm) |
| Comparative Example 1 | 4.5 µA | 35 kV/mm (10.5 kV/0.3 mm) |
| Comparative Example 2 | 0.8 µA | 65 kV/mm (19.5 kV/0.3 mm) |

As a result of the evaluation, in both the ceramic materials of Examples 1 and 2, the critical current value exceeded 5 µA and the withstand voltage was 5 µA or more. For this reason, it can be determined that the ceramic materials of Examples 1 and 2 have excellent durability.

In contrast, in the ceramic materials of Comparative Examples 1 and 2, although the withstand voltage was 5 µA or more, the critical current value was less than 5 µA. For this reason, in the ceramic materials of Comparative Examples 1 and 2, the electric charge electrically charged to the ceramic material cannot be discharged before the ceramic material is electrically discharged, and thus it can be determined that a period until insulation failure occurs is shortened.

(Durability Evaluation)

Electrostatic chuck devices were manufactured by manufacturing the base (each of the mounting plates and the supporting plates) using the ceramic materials (composite sintered bodies) produced in Examples 1 and 2 and Comparative Examples 1 and 2. Durability evaluation was performed by using the manufactured electrostatic chuck devices for 1000 hours in a plasma etching apparatus. The evaluation results are shown in Table 3.

TABLE 3

|  | β-SiC | | α-SiC | | | |
| --- | --- | --- | --- | --- | --- | --- |
|  | Density (%) | 3C rate (%) | 4H rate (%) | 6H rate (%) | Crystallite diameter (nm) | Durability evaluation |
| Example 1 | 99.2 | >85 | <10 | <5 | 96 | No problem |
| Example 2 | 98.4 | 73 to 78 | 22 | <5 | 84 | No problem |
| Example 3 | 98.5 | >85 | <10 | <5 | 85 | No problem |
| Comparative Example 1 | 98.3 | 36 | 51 | 13 | 120 | Insulation failure occurrence Broken with α layer as starting point |
| Comparative Example 2 | 98.7 | — | — | — | — | Unusable due to electric discharge |

As a result of the evaluation, in the electrostatic chuck devices using the ceramic materials (composite sintered bodies) of Examples 1 to 3, it was found that there was no problem such as insulation failure of the composite sintered body even after use of 1000 hours and the durability was high.

On the other hand, in the electrostatic chuck device using the ceramic material (composite sintered body) of Comparative Example 1, at the point in time when it was used for 600 hours, the ceramic material could not be used due to occurrence of insulation failure. When a site where the insulation failure of the ceramic material occurred was observed using a transmission electron microscope (TEM), it was confirmed that α-type SiC was present therein.

In the electrostatic chuck device using the ceramic material (sintered compact) of Comparative Example 2, electric discharge occurred in the electrostatic chuck device, and thus the electrostatic chuck device could not be used.

Figure 6:
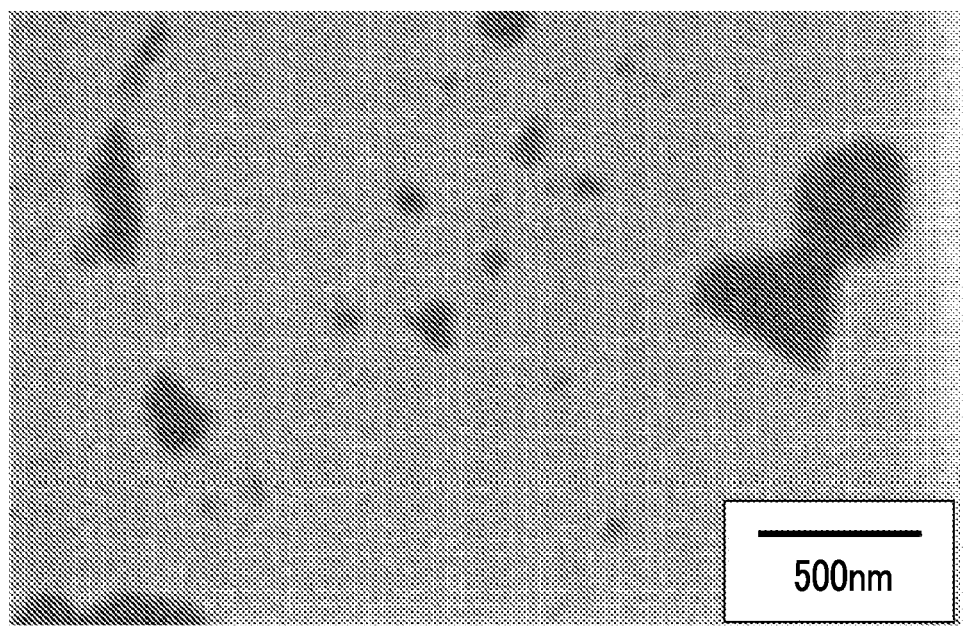
FIG. 6 is an SIM image of a composite sintered body of Example 1.

FIG. 6 is an SIM (Scanning Ion Microscope) image of the ceramic material (the composite sintered body) of Example 1 and is an image of the surface exposed by scraping the surface of the ceramic material by 500 nm with a focused ion beam device.

The places where the contrast of the photograph is dark exhibit SiC particles. As can be seen from the drawing, SiC particles grain-grew larger than the particle diameter (0.04 μm) of the raw material were observed. Further, the particle shape of the SiC particle was amorphous. Further, it was observed that a neck was formed at the boundary between the SiC particles, and it was confirmed that the SiC particles were sintered with each other.

From the above results, it was confirmed that the present invention is useful.

REFERENCE SIGNS LIST

1: electrostatic chuck device
11a: mounting surface
13: electrostatic attraction electrode
W: plate-shaped sample

The invention claimed is:

1. A ceramic material that is a composite sintered body including an insulating ceramic and silicon carbide,
wherein crystal grains of the silicon carbide are dispersed in at least one selected from the group consisting of a crystal grain boundary and a crystal grain of a main phase formed by sintering crystal grains of the insulating ceramic,
a content of crystal grains having a β-SiC type crystal structure is more than 60% by volume with respect to a total amount of the crystal grains of the silicon carbide,
the ceramic material includes a portion in which the crystal grains having the β-SiC type crystal structure are sintered with each other,
in the silicon carbide particles in the composite-sintered body, fine silicon carbide particles having a particle diameter of 0.04 μm or less are included in an amount of 0.001% by volume or more with respect to the entire composite sintered body,
the composite sintered body includes pores which are present in a crystal grain boundary, and
a ratio of an apparent density of the composite sintered body with respect to a hypothetical true density when the composite sintered body is assumed not to include the pores is 97% or more.

2. The ceramic material according to claim 1,
wherein a grain diameter obtained from an X-ray diffraction result of the crystal grain of the silicon carbide is 50 nm or more.

3. The ceramic material according to claim 1,
wherein the insulating ceramic is aluminum oxide.

4. A ceramic material which is a composite sintered body of aluminum oxide and silicon carbide,
wherein crystal grains of the silicon carbide are dispersed in a crystal grain boundary and a crystal grain of a main phase formed by sintering crystal grains of the aluminum oxide, and
in an X-ray diffraction pattern obtained by irradiating a surface of the composite sintered body with CuK α rays, a ratio (I1/I3) of a peak (I1) which is observed around 2θ=33.7 degrees and a peak (I3) which is observed around 2θ=35.8 degrees is 0.05 or less,
the ceramic material includes a portion in which the crystal grains having the β-SiC type crystal structure are sintered with each other,
in the silicon carbide particles in the composite-sintered body, fine silicon carbide particles having a particle diameter of 0.04 μm or less are included in an amount of 0.001% by volume or more with respect to the entire composite sintered body, and
in the X-ray diffraction pattern, a ratio (I2/I3) of a peak (I2) which is observed around 2θ=34.1 degrees and the peak (I3) which is observed around 2θ=35.8 degrees is 0.01 or less.

5. An electrostatic chuck device comprising:
a base using the ceramic material according to claim 1 as a forming material and having one principal surface which is a mounting surface on which a plate-shaped sample is mounted; and
an electrostatic attraction electrode provided on a side opposite to the mounting surface of the base or in an interior of the base.

6. The ceramic material according to claim 1,
wherein in the composite sintered body, a crystallite diameter of a crystal grain of the silicon carbide is 50 nm or more, and 100 nm or less, in which the crystallite diameter is obtained from the X-ray diffraction result.

7. The ceramic material according to claim 4,
wherein in the composite sintered body, a crystallite diameter of a crystal grain of the silicon carbide is 50 nm or more, and 100 nm or less, in which the crystallite diameter is obtained from the X-ray diffraction result.

* * * * *